United States Patent
Takagi et al.

(10) Patent No.: US 8,093,578 B2
(45) Date of Patent: Jan. 10, 2012

(54) NONVOLATILE MEMORY ELEMENT, NONVOLATILE MEMORY ELEMENT ARRAY, AND METHOD FOR MANUFACTURING NONVOLATILE MEMORY ELEMENT

(75) Inventors: Takeshi Takagi, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 270 days.

(21) Appl. No.: 12/513,638

(22) PCT Filed: Nov. 16, 2007

(86) PCT No.: PCT/JP2007/072307
§ 371 (c)(1),
(2), (4) Date: May 5, 2009

(87) PCT Pub. No.: WO2008/062734
PCT Pub. Date: May 29, 2008

(65) Prior Publication Data
US 2010/0065807 A1    Mar. 18, 2010

(30) Foreign Application Priority Data
Nov. 20, 2006    (JP) .................................. 2006-312589

(51) Int. Cl.
*H01L 27/10*    (2006.01)
*H01L 21/02*    (2006.01)
(52) U.S. Cl. ................. 257/5; 257/E21.006; 257/E27.07
(58) Field of Classification Search ....... 257/5, E21.006, 257/E27.07
See application file for complete search history.

(56) References Cited

U.S. PATENT DOCUMENTS

| 6,753,561 | B1 * | 6/2004 | Rinerson et al. | 257/295 |
|---|---|---|---|---|
| 2004/0147081 | A1 | 7/2004 | Hsu et al. | |
| 2004/0171215 | A1 | 9/2004 | Hsu et al. | |
| 2006/0081961 | A1 * | 4/2006 | Tanaka et al. | 257/536 |

FOREIGN PATENT DOCUMENTS

| JP | 11-126883 | 5/1999 |
|---|---|---|
| JP | 2002-151659 | 5/2002 |
| JP | 2004-185755 | 7/2004 |
| JP | 2004-228561 | 8/2004 |
| JP | 2004-260162 | 9/2004 |
| JP | 2005-039299 | 2/2005 |
| JP | 2006-066934 | 3/2006 |
| JP | 2006-120707 | 5/2006 |
| JP | 2006-203098 | 8/2006 |
| JP | 2007-027755 | 2/2007 |

* cited by examiner

*Primary Examiner* — Matthew W Such
*Assistant Examiner* — Monica D Harrison
(74) *Attorney, Agent, or Firm* — McDermott Will & Emery LLP

(57) ABSTRACT

The present invention is configured such that a resistance variable element (16) and a rectifying element (20) are formed on a substrate (12). The resistance variable element (16) is configured such that a resistance variable layer (14) made of a metal oxide material is sandwiched between a lower electrode (13) and an upper electrode (15). The rectifying element (20) is connected to the resistance variable element (16), and is configured such that a blocking layer (18) is sandwiched between a first electrode layer (17) located on a lower side of the blocking layer (18) and a second electrode layer (19) located on an upper side of the blocking layer (18). The resistance variable element (16) and the rectifying element (20) are connected to each other in series in a thickness direction of the resistance variable layer (14), and the blocking layer (18) is formed as a barrier layer having a hydrogen barrier property.

72 Claims, 18 Drawing Sheets (a)

(b)

(c)

(d)

(a)

(b)

(c)

(d)

(a)

(b)

(c)

(d)

(a)

(b)

(c)

(a)

(b)

(a)

(b)

(c)

(d)

(a)

(b)

(c)

(d)

NONVOLATILE MEMORY ELEMENT, NONVOLATILE MEMORY ELEMENT ARRAY, AND METHOD FOR MANUFACTURING NONVOLATILE MEMORY ELEMENT

RELATED APPLICATIONS

This application is the U.S. National Phase under 35 U.S.C. §371 of International Application No. PCT/JP2007/072307, filed on Nov. 16, 2007, which in turn claims the benefit of Japanese Application No. 2006-312589, filed on Nov. 20, 2006, the disclosures of which Applications are incorporated by reference herein.

TECHNICAL FIELD

The present invention relates to a nonvolatile memory element suitable for miniaturization and mass production, a nonvolatile memory element array, and a method for manufacturing the nonvolatile memory element.

BACKGROUND ART

In recent years, functions of portable digital equipment, such as compact thin digital AV players and digital cameras, have been enhanced, and therefore, there is a growing need for large-capacity high-speed nonvolatile memory elements used as memory elements of the above equipment. To meet the need, a nonvolatile memory element using a ferroelectric capacitor is available.

Many of ferroelectric layers are made of an oxide. Therefore, such memory materials need to be manufactured by a manufacturing process which does not expose the memory materials to a reduction atmosphere, such as a hydrogen atmosphere, and the nonvolatile memory element having an element structure which can be manufactured in such manufacturing process is required.

Generally, in a final step of the manufacturing process of a semiconductor element in which MOS transistors are integrated, the MOS transistors damaged by, for example, sputtering are subjected to a heat treatment in a gas containing hydrogen to restore the characteristics of the MOS transistors. Moreover, in a manufacturing process of the nonvolatile memory element using the ferroelectric, the surface of a semiconductor substrate on which the semiconductor element is manufactured is covered with an interlayer insulating layer, such as a BPSG layer, a PSG layer, or the like. However, it is known that in the case of forming such interlayer insulating layer, hydrogen is generated as a product.

To prevent the ferroelectric layer to be exposed to hydrogen generated in such manufacturing process, one example is that in a semiconductor memory apparatus using the ferroelectric capacitor, the ferroelectric layer is entirely covered with an insulating hydrogen barrier layer. However, the insulating hydrogen barrier layer is not electrically conductive. Therefore, a contact hole is formed on the insulating hydrogen barrier layer for electrical connection to penetrate therethrough, and a hydrogen barrier material, such as TiN, having both the electrical conductivity and the hydrogen barrier property is embedded in the contact hole using CVD. Thus, an upper electrode of the ferroelectric capacitor and a wire on the insulating hydrogen barrier layer are electrically connected to each other, and the ferroelectric layer is protected by the insulating hydrogen barrier layer and the hydrogen barrier material embedded in the contact hole without being exposed to hydrogen (see Patent Document 1 for example).

Moreover, there is another example in which the upper electrode and a lower electrode sandwiching the ferroelectric layer are entirely covered with the hydrogen barrier layer, or only the upper electrode is covered with the hydrogen barrier layer, and the connections between the ferroelectric capacitor and other circuit elements, wires, etc. are realized by drop contact using a plug (see Patent Documents 2 and 3 for example).

Moreover, there is still another example in which a layer, such as a TaSiN layer, which maintains an amorphous state even if a heat treatment for crystallizing the ferroelectric layer is carried out is formed as a hydrogen barrier layer on or above the capacitor constituted by the ferroelectric layer. The TaSiN layer has an excellent effect of blocking hydrogen and has electrical conductivity. Therefore, without forming a hole on the hydrogen barrier layer, the upper electrode of the capacitor and an external electrode can be electrically connected to each other by the TaSiN layer (see Patent Document 4 for example).

Moreover, the nonvolatile memory element using not the ferroelectric but the resistance variable layer as the memory material is known (see Patent Document 5 for example).

Patent Document 1: Japanese Laid-Open Patent Application Publication 2002-151659

Patent Document 2: Japanese Laid-Open Patent Application Publication 2005-39299

Patent Document 3: Japanese Laid-Open Patent Application Publication 2006-66934

Patent Document 4: Japanese Laid-Open Patent Application Publication Hei 11-126883

Patent Document 5: Japanese Laid-Open Patent Application Publication 2004-185755

DISCLOSURE OF THE INVENTION

Problems to be Solved by the Invention

There is a need for improvement of the yield of a method for manufacturing the nonvolatile memory element using the resistance variable layer.

Moreover, the nonvolatile memory element using the resistance variable layer is suitable for miniaturization and high integration. The nonvolatile memory element using the resistance variable layer is easily highly integrated by using, for example, a cross-point structure. However, the problem is that when writing data to a certain memory cell, a trouble (hereinafter referred to as "write disturb") of unintentionally writing the data to the other memory cell since a resistance value of the other memory cell is changed by a bypass current occurs.

The present invention was made to solve the above problems, and an object of the present invention is to provide a nonvolatile memory element using a resistance variable layer having an element configuration which does not cause the write disturb and has high yield rate, and a method for manufacturing the nonvolatile memory element which can be manufactured while simplifying the process of realizing this element configuration. Another object of the present invention is to provide a nonvolatile memory element having an element configuration which is compatible with a semiconductor process of a process rule of less than 100 nm and is highly mass productive, and a method for manufacturing the nonvolatile memory element.

Means for Solving the Problems

The present invention was made based on a new finding obtained by the inventors in developing the nonvolatile memory element. The new finding is that since a resistance variable layer contains a metal oxide, it is reduced by exposure to hydrogen, and this changes the characteristics of the resistance variable layer. This change of the characteristics of the resistance variable layer causes the decrease in yield rate of the nonvolatile memory element using the resistance variable layer.

Generally, hydrogen is not utilized when forming the resistance variable layer and the nonvolatile memory element. However, hydrogen may be used in the semiconductor process, such as a case of forming the transistors on the same substrate as described above, or hydrogen may be generated from a specific material constituting the apparatus. Hydrogen is high in permeability, and diffuses inside the substrate, metal, and the like. If hydrogen reaches the resistance variable layer, it deteriorates the resistance variable layer. Therefore, it is necessary to prevent hydrogen from reaching the resistance variable layer. It is possible to prevent hydrogen from reaching the resistance variable layer by disposing a member having the hydrogen barrier property in the vicinity of the resistance variable layer.

However, in the case of covering the ferroelectric layer and/or the resistance variable layer with the hydrogen barrier layer having only a hydrogen barrier function, a special step of forming only the hydrogen barrier layer is required, and this increases the number of steps. Moreover, in the case of covering the ferroelectric layer and/or the resistance variable layer, which require the hydrogen barrier, with the hydrogen barrier layer, and forming, for example, the drop contact for electrical connection from an electrode portion of the element constituted by the above layers, the number of steps further increases. The configuration of the apparatus becomes complex if the hydrogen barrier layer is additionally formed. It is necessary to protect the resistance variable layer from hydrogen while simplifying the configuration of the apparatus and the manufacturing process.

To achieve the above object, a nonvolatile memory element of the present invention includes: a resistance variable element including an upper electrode, a lower electrode, and a resistance variable layer interposed between the upper electrode and the lower electrode and containing a metal oxide material; and a rectifying element including a first electrode layer, a second electrode layer, and a blocking layer sandwiched between the first electrode layer and the second electrode layer, wherein: the resistance variable element and the rectifying element are connected to each other in series in a thickness direction of the resistance variable layer; and the blocking layer has a hydrogen barrier property.

With this configuration, it is possible to realize the nonvolatile memory element which does not cause the write disturb and can protect the resistance variable layer from hydrogen. Since the blocking layer also serves as the hydrogen barrier layer, the resistance variable layer can be protected from hydrogen by a simple configuration, and the yield can also be improved.

Note that the hydrogen barrier property denotes a property of preventing hydrogen from invading (seeping).

Moreover, the rectifying element may be configured to be an MIM (Metal-Insulator-Metal) diode, an MSM (Metal-Semiconductor-Metal) diode, or a schottky diode.

With this configuration, since among the rectifying elements, the diode having high current drivability is used, the write disturb can be prevented, and necessary and sufficient current can be applied to the resistance variable element.

Moreover, the rectifying element may be configured to be stacked on the resistance variable element. With this configuration, it is possible to realize the nonvolatile memory element which does not cause the write disturb and is highly integrated.

Moreover, when viewed from the thickness direction of the resistance variable layer, the blocking layer may be configured to be larger in area than the resistance variable layer.

With this configuration, when viewed from the thickness direction (stack direction) of the resistance variable layer, the resistance variable layer is completely covered with the blocking layer. Therefore, the resistance variable layer can be more surely prevented from hydrogen.

Moreover, at least one of the upper electrode, the first electrode layer, and the second electrode layer may be configured to have the hydrogen barrier property.

With this configuration, since the layer having the hydrogen barrier property protects the resistance variable layer, it is possible to realize the nonvolatile memory element having high durability with respect to hydrogen.

Moreover, a nonvolatile memory element array of the present invention includes a plurality of the nonvolatile memory elements, wherein: a plurality of the lower electrodes are formed on a first flat plane parallel to a main surface of the substrate so as to extend in parallel with one another; a plurality of the upper electrodes are formed on a second flat plane parallel to the first flat plane so as to extend in parallel with one another and three-dimensionally cross the lower electrodes; the resistance variable layer is disposed to correspond to each of three-dimensional cross-points where the lower electrodes and the upper electrodes cross each other and to be interposed between the lower electrode and the upper electrode; and this forms the nonvolatile memory element corresponding to each of the three-dimensional cross-points.

Moreover, the nonvolatile memory element array of the present invention includes a plurality of the nonvolatile memory elements, wherein: a plurality of the lower electrodes are formed on a first flat plane parallel to a main surface of the substrate so as to extend in parallel with one another; a plurality of the second electrode layers are formed on a second flat plane parallel to the first flat plane so as to extend in parallel with one another and three-dimensionally cross the lower electrodes; the resistance variable layer is disposed to correspond to each of three-dimensional cross-points where the lower electrodes and the second electrode layers cross each other and to be interposed between the lower electrode and the second electrode layer; and this forms the nonvolatile memory element corresponding to each of the three-dimensional cross-points.

With this configuration, the cross-point type nonvolatile memory element which is highly integrated can be manufactured by a mass production process compatible with a process adapted for miniaturization in which a process rule of less than 100 nm is main.

Moreover, the nonvolatile memory element may be configured to further include a metal wire layer on the second electrode layer. With this configuration, the wiring resistance of the second electrode layer and the wiring resistance of the wire connected to the second electrode layer can be set to a low resistance, and the increase in speed and the noise reduction of the memory cell and the nonvolatile memory element can be further realized.

Moreover, the upper electrode and the first electrode layer may be formed as a single common electrode. With this configuration, it is possible to further simplify the configuration and manufacturing process of the nonvolatile memory element.

Moreover, the resistance variable element may be configured to be stacked on the rectifying element. With this configuration, it is possible to realize the nonvolatile memory element which does not cause the write disturb and is highly integrated.

Moreover, the upper electrode may be configured to have the hydrogen barrier property. With this configuration, since the upper electrode protects the resistance variable layer, it is possible to realize the nonvolatile memory element having higher durability with respect to hydrogen.

Moreover, the nonvolatile memory element array of the present invention includes a plurality of the nonvolatile memory elements, wherein: a plurality of the first electrode layers are formed on a first flat plane parallel to a main surface of the substrate so as to extend in parallel with one another; a plurality of the upper electrodes are formed on a second flat plane parallel to the first flat plane so as to extend in parallel with one another and three-dimensionally cross the first electrode layers; the resistance variable layer is disposed to correspond to each of three-dimensional cross-points where the first electrode layers and the upper electrodes cross each other and to be interposed between the first electrode layer and the upper electrode; and this forms the nonvolatile memory element corresponding to each of the three-dimensional cross-points.

With this configuration, the cross-point type nonvolatile memory element which is highly integrated can be manufactured by the mass production process compatible with the process adapted for miniaturization in which the process rule of less than 100 nm is main.

Moreover, the nonvolatile memory element may be configured to further include a metal wire layer on the upper electrode. With this configuration, the wiring resistance of the upper electrode and the wiring resistance of the wire connected to the upper electrode can be set to a low resistance, and the increase in speed and the noise reduction of the memory cell and the nonvolatile memory element can be further realized.

Moreover, the lower electrode and the second electrode layer may be formed as a single common electrode. With this configuration, it is possible to further simplify the configuration and manufacturing process of the nonvolatile memory element.

Moreover, the nonvolatile memory element may be configured to further include: a first interlayer insulating layer formed on the lower electrode to cover the lower electrode; and a first contact hole formed to penetrate the first interlayer insulating layer and reach the lower electrode, wherein: the first interlayer insulating layer has the hydrogen barrier property; and the resistance variable layer is embedded in the first contact hole.

With this configuration, since the resistance variable layer is embedded in the first contact hole, and an upper portion of the resistance variable layer is covered with the barrier layer having the hydrogen barrier property, the possibility that the resistance variable layer contacts hydrogen decreases, and thus, the resistance variable layer is protected from hydrogen. In addition, since the resistance variable layer is embedded in the first contact hole, the resistance variable layer is electrically isolated from the adjacent memory cell. Therefore, the cross talk does not occur, and the resistance variation can be stably repeated. Since the first interlayer insulating layer has the hydrogen barrier property, the resistance variable layer is further effectively protected from hydrogen. Therefore, the durability of the nonvolatile memory element with respect to hydrogen further improves.

Moreover, the upper electrode may be configured to be embedded in the first contact hole to be located on the resistance variable layer.

With this configuration, since the resistance variable layer is surely covered with the barrier layer having the hydrogen barrier property, the possibility that the resistance variable layer contacts hydrogen decreases, and thus, the resistance variable layer is protected from hydrogen. Further, the rectifying element can be formed on the resistance variable layer in a self-aligning manner so as to be electrically isolated from the resistance variable layer. Therefore, it is possible to realize the nonvolatile memory element which is highly integrated and does not cause the cross talk.

Moreover, the blocking layer may be configured to be a layer containing nitrogen.

Moreover, the blocking layer may be configured to contain one or more materials selected from the group consisting of SiN, SiON, and TiAlON.

Moreover, the electrode or the electrode layer may be configured to contain at least one material selected from the group consisting of TiAlN, TiN, TaN, TaAlN, and TaSiN.

With this configuration, since the blocking layer located above the resistance variable layer, the electrode, and/or the electrode layer serve as the hydrogen barrier layer, the possibility that the resistance variable layer contacts hydrogen decreases, and thus, the resistance variable layer is protected from hydrogen.

Moreover, the nonvolatile memory element may further include: a first interlayer insulating layer formed on the lower electrode to cover the lower electrode; a second interlayer insulating layer covering the first interlayer insulating layer; and a first contact hole formed to penetrate the first interlayer insulating layer and the second interlayer insulating layer and reach the lower electrode, wherein: the second interlayer insulating layer has the hydrogen barrier property; and the resistance variable layer is embedded in the first contact hole.

With this configuration, since the resistance variable layer is covered with the blocking layer and the second interlayer insulating layer, the resistance variable layer can be further surely protected from hydrogen.

Moreover, a method for manufacturing a nonvolatile memory element includes: a step of forming a lower electrode on a substrate; a resistance layer forming step of forming a resistance variable layer on the lower electrode; an upper electrode forming step of forming an upper electrode on the resistance variable layer; and a step of forming a rectifying element including a blocking layer on the upper electrode, wherein the blocking layer is formed as a barrier layer having a hydrogen barrier property.

With this configuration, since any one of the upper electrode and the layers forming the rectifying element which are located above the resistance variable layer is formed as the barrier layer having the hydrogen barrier property, the possibility that the resistance variable layer contacts hydrogen decreases, and thus, the resistance variable layer is protected from hydrogen. Moreover, the write disturb can be prevented by forming the rectifying element.

The above object, other objects, features and advantages of the present invention will be made clear by the following detailed explanation of preferred embodiments with reference to the attached drawings.

EFFECTS OF THE INVENTION

A nonvolatile memory element of the present invention uses a memory cell Having a configuration in which a resistance variable element using a resistance variable Layer and a rectifying element are connected to each other in series in a stack direction. With this configuration, write disturb, cross talk, and the like from an adjacent memory cell are prevented. Further, to prevent the resistance variable layer from being exposed to a hydrogen atmosphere, a blocking layer disposed on or above the resistance variable layer is formed as a barrier layer having a hydrogen barrier property. With this configuration, the possibility that the resistance variable layer contacts hydrogen decreases, and thus, the resistance variable layer is protected from hydrogen. In a cross-point type nonvolatile memory element suitable for high integration, the rectifying element is connected to resistance variable element in each memory cell to prevent the write disturb of flowing the bypass current from an adjacent memory cell. To further utilize this configuration, an MIM diode or the like having high current drivability is used as the rectifying element, and the barrier layer having the hydrogen barrier property is used as the blocking layer constituting the diode. With this, the possibility that the resistance variable layer is exposed to the hydrogen atmosphere decreases. Further, by forming an electrode layer of the resistance variable element and an electrode layer of the diode as a single layer, the configuration of the memory cell can be made compact and simplified.

Moreover, when data is not read out from or written to the memory cell in which the resistance variable element and the rectifying element are connected to each other in series, voltage is not applied to the rectifying element. Therefore, the rectifying element is a high-resistance state. On this account, as compared to the memory cell constituted by only the resistance variable element, the resistance variable element can be further protected from electrical noise, and the like. Further, when data is read out from or written to the memory cell, the voltage applied to the memory cell is an applied voltage which has been stably dropped by the rectifying element to have a stable magnitude. Therefore, it is possible to surely prevent unintentional rewriting caused by a high voltage applied to the resistance variable element. Thus, a highly reliable nonvolatile memory element can be realized.

Moreover, the cross-point type nonvolatile memory element of the present invention can be manufactured by a mass production process compatible with a process adapted for miniaturization in which a process rule of less than 100 nm is main. Since the diode having high current drivability is connected as the rectifying element to the resistance variable element in series, the resistance variable element can stably repeat resistance variation.

By using the nonvolatile memory element of the present invention, electronic devices, such as portable information equipment and information appliance equipment, can be further reduced in size and thickness and obtain high reliability.

BRIEF DESCRIPTION OF THE DRAWINGS

FIG. 1(a) is a schematic diagram when viewed from a semiconductor chip surface. FIG. 1(b) is a schematic cross-sectional view taken along line A-A of FIG. 1(a) when viewed from a direction indicated by arrows A. FIG. 1(c) is a schematic cross-sectional view taken along line B-B of FIG. 1(a) when viewed from a direction indicated by arrows B.

FIG. 2(a) is a schematic diagram when viewed from the semiconductor chip surface. FIG. 2(b) is a schematic cross-sectional view taken along line C-C of FIG. 2(a) when viewed from a direction indicated by arrows C. FIG. 2(c) is a schematic cross-sectional view taken along line D-D of FIG. 2(a) when viewed from a direction indicated by arrows D.

FIG. 9(a) is a schematic cross-sectional view taken along line G-G of FIG. 8 when viewed from a direction indicated by arrows G. FIG. 9(b) is a schematic cross-sectional view taken along line H-H of FIG. 8 when viewed from a direction indicated by arrows H.

FIG. 10(a) is a schematic diagram when viewed from the semiconductor chip surface. FIG. 10(b) is a schematic cross-sectional view taken along line I-I of FIG. 10(a) when viewed from a direction indicated by arrows I. FIG. 10(c) is a schematic cross-sectional view taken along line J-J of FIG. 10(a) when viewed from a direction indicated by arrows J.

FIG. 11(a) is a schematic diagram when viewed from the semiconductor chip surface. FIG. 11(b) is a schematic cross-sectional view taken along line K-K of FIG. 11(a) when viewed from a direction indicated by arrows K. FIG. 11(c) is a schematic cross-sectional view taken along line L-L of FIG. 11(a) when viewed from a direction indicated by arrows L.

FIG. 15(a) is a schematic cross-sectional view taken along line Y-Y of FIG. 14 when viewed from a direction indicated by arrows Y. FIG. 15(b) is a schematic cross-sectional view taken along line Z-Z of FIG. 14 when viewed from a direction indicated by arrows Z.

FIG. 16(a) is a schematic diagram when viewed from the semiconductor chip surface. FIG. 16(b) is a schematic cross-sectional view taken along line C-C of FIG. 16(a) when viewed from a direction indicated by arrows C. FIG.

Figure 1:
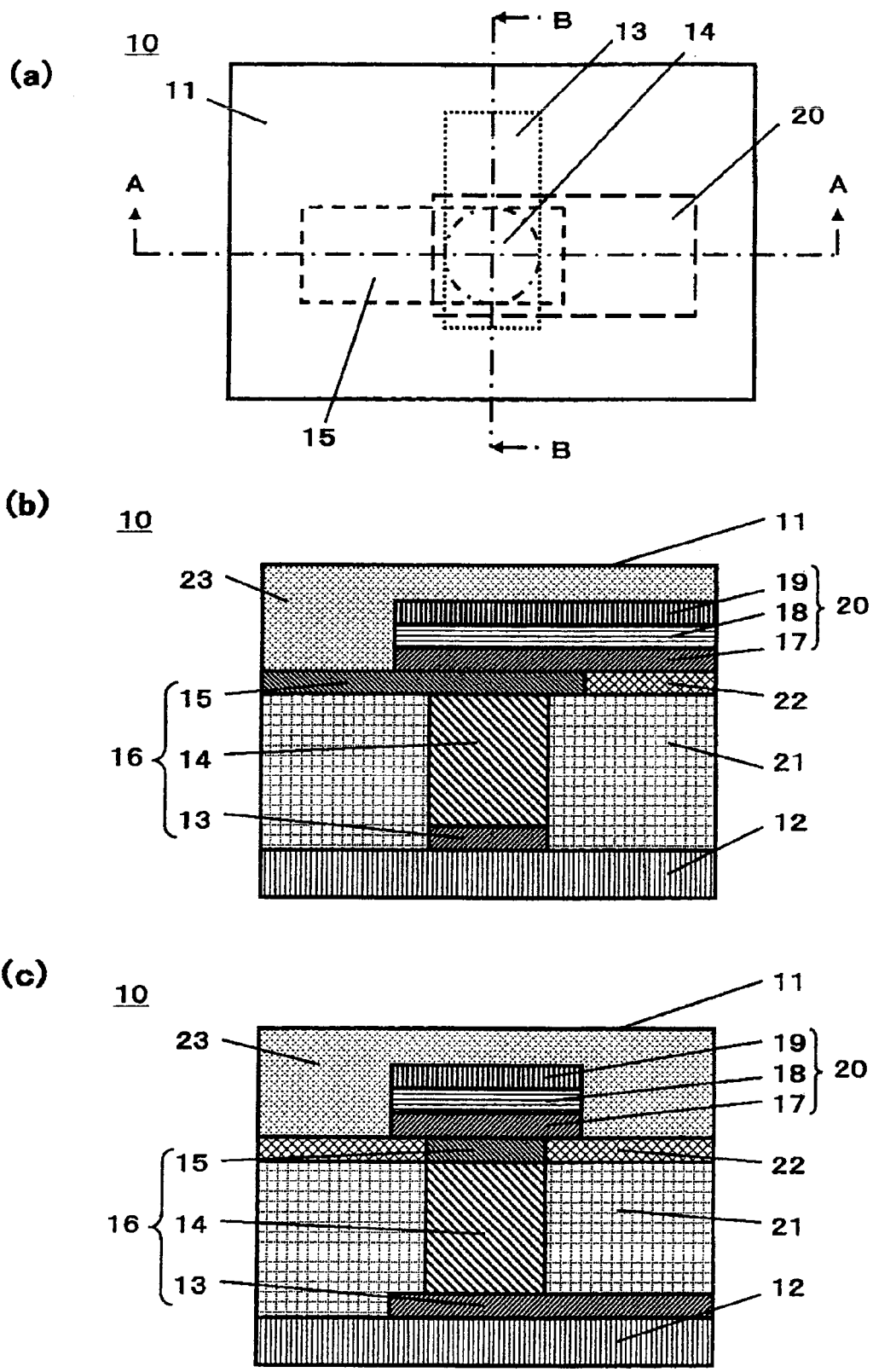
FIG. 1 are schematic configuration diagrams of a nonvolatile memory element in Embodiment 1 of the present invention.

16(c) is a schematic cross-sectional view taken along line D-D of FIG. 16(a) when viewed from a direction indicated by arrows D.

FIGS. 17(a) to 17(d) are schematic cross-sectional views showing the method for manufacturing the nonvolatile memory element of Embodiment 6 of the present invention.

FIGS. 18(a) to 18(d) are schematic cross-sectional views showing the method for manufacturing the nonvolatile memory element of Embodiment 6 of the present invention.

EXPLANATION OF REFERENCE NUMBERS 10, 30, 45, 50, 60 nonvolatile semiconductor element
40, 55 nonvolatile semiconductor element array
11, 31, 36 semiconductor chip surface
12 substrate
13, 13a, 13b, 13c, 13d, 13e, 13f, 13g, 13h lower electrode
14 resistance variable layer
15, 15a, 15b, 15c, 15d, 15e, 15f, 15g, 15h upper electrode
16 resistance variable element
17, 17a, 17b, 17c, 17d, 17e, 17f, 17g, 17h first electrode layer
18 blocking layer
19, 19a, 19b, 19c, 19d, 19e, 19f, 19g, 19h second electrode layer
20 rectifying element
21 first interlayer insulating layer
22, 28 second interlayer insulating layer
23, 38 third interlayer insulating layer
24 first contact hole
25 recess
26 SiN layer
27 Al material
31 substrate surface
34 groove
37 metal wire layer
51 lower interlayer insulating layer
52 lower contact hole

BEST MODE FOR CARRYING OUT THE INVENTION

Hereinafter, a nonvolatile memory element, a nonvolatile memory element array, and a method for manufacturing the nonvolatile memory element according to embodiments of the present invention will be explained in reference to the drawings. In the drawings, same reference numbers are used for the same components, and a repetition of the same explanation may be avoided.

Embodiment 1

FIGS. 1 to 7 are diagrams showing Embodiment 1 of the present invention. FIG. 1 are schematic configuration diagrams of a nonvolatile memory element 10 of Embodiment 1 of the present invention. FIG. 1(a) is a schematic diagram showing a schematic configuration of the nonvolatile memory element 10 when viewed from a semiconductor chip surface 11. FIG. 1(b) is a schematic cross-sectional view taken along line A-A of FIG. 1(a) when viewed from a direction indicated by arrows A. FIG. 1(c) is a schematic cross-sectional view taken along line B-B of FIG. 1(a) when viewed from a direction indicated by arrows B.

In FIG. 1(a), a lower electrode 13 and an upper electrode 15 are disposed to sandwich a resistance variable layer 14 in a stack direction (thickness direction of the resistance variable layer 14; the same is true in the following explanation), and a rectifying element 20 is disposed on the upper electrode 15.

Moreover, as shown in FIGS. 1(b) and 1(c), the nonvolatile memory element 10 is configured such that a resistance variable element 16 and the rectifying element 20 are formed on a substrate 12. The resistance variable element 16 is configured such that the resistance variable layer 14 made of a metal oxide material is sandwiched between the upper electrode 15 and the lower electrode 13. The rectifying element 20 is connected to the resistance variable element 16 and is configured such that a blocking layer 18 is sandwiched between a first electrode layer 17 located on a lower side of the blocking layer 18 and a second electrode layer 19 located on an upper side of the blocking layer 18. The resistance variable element 16 and the rectifying element 20 are connected to each other in series in the stack direction. Among the upper electrode 15 and the layers of the rectifying element 20 which are disposed on or above the resistance variable layer 14, at least the blocking layer 18 is a barrier layer having a hydrogen barrier property. When viewed from the thickness direction of the layers, the area (cross-sectional area taken along a plane parallel to a main surface of the substrate 12; the same is true in the following explanation) of the blocking layer 18 is larger than the area of the resistance variable layer 14. With this configuration, the resistance variable layer 14 can be effectively protected from hydrogen.

In addition to the blocking layer 18, one or both of the first electrode layer 17 and the second electrode layer 19 may be configured to be the barrier layer having the hydrogen barrier property. With this configuration, the resistance variable layer 14 can be further effectively protected from hydrogen.

The resistance variable layer 14 does not have to contact the upper electrode 15 and the lower electrode 13. Some kind of layer may be interposed between the resistance variable layer and the electrode.

Moreover, the resistance variable layer 14 is surrounded by a first interlayer insulating layer 21, and the upper electrode 15 is surrounded by a second interlayer insulating layer 22. Further, the rectifying element 20 formed on the upper electrode 15 and the second interlayer insulating layer 22 is surrounded by and covered with a third interlayer insulating layer 23. One or a plurality of the first interlayer insulating layer 21, the second interlayer insulating layer 22, and the third interlayer insulating layer may be the barrier layer having the hydrogen barrier property. With this configuration, the resistance variable layer 14 can be further effectively protected from hydrogen.

With this configuration, by the rectifying element 20 which is stacked on the resistance variable element 16 to be connected to the resistance variable element 16 in series in the stack direction, the write disturb is prevented, and in addition, the resistance variable element 16 can be driven by high current drivability. To be specific, the rectifying element 20 may be an MIM (Metal-Insulator-Metal) diode, an MSM (Metal-Semiconductor-Metal) diode, or a schottky diode. As compared to a PN junction diode for example, the above diode can drive by a large current drivability the resistance variable element 16 connected to the diode in series.

Further, it is possible to prevent the resistance variable layer 14 from contacting hydrogen by the blocking layer 18, having the hydrogen barrier property, of the rectifying element 20 located on the resistance variable element 16. To be specific, as long as a manufacturing process of manufacturing the nonvolatile memory element 10 does not use the hydrogen atmosphere, and a manufacturing method in which hydrogen is generated and remains is not used, it is possible to prevent the resistance variable layer 14 from contacting hydrogen even if the resistance variable layer 14 is placed in the hydrogen atmosphere after manufacturing the nonvolatile memory element 10, since the blocking layer 18 has the hydrogen barrier property. Therefore, even if hydrogen is used in a step of forming a circuit element (not shown) and a wire (not shown) on the third interlayer insulating layer 23 formed at an upper portion of the nonvolatile memory element 10, the possibility that the resistance variable layer 14 contacts hydrogen decreases, and thus, the resistance variable layer 14 is protected from hydrogen. Since the possibility that the nonvolatile memory element contacts hydrogen decreases, and this, the nonvolatile memory element is protected from hydrogen when forming the circuit element and the wire, it is possible to carry out the manufacturing process which uses the hydrogen atmosphere or the manufacturing process in which hydrogen is generated and remains. To be specific, it is possible to form the circuit element and the wire by a mass production process compatible with a process adapted for miniaturization in which a normally used process rule of less than 100 nm is main. Moreover, in a case where the layers (the first electrode layer 17, the second electrode layer 19, the first interlayer insulating layer 21, the second interlayer insulating layer 22, and the third interlayer insulating layer 23) are made of a material having the hydrogen barrier property in addition to the blocking layer 18, the resistance variable layer 14 can be further surely protected from hydrogen.

Figure 2:
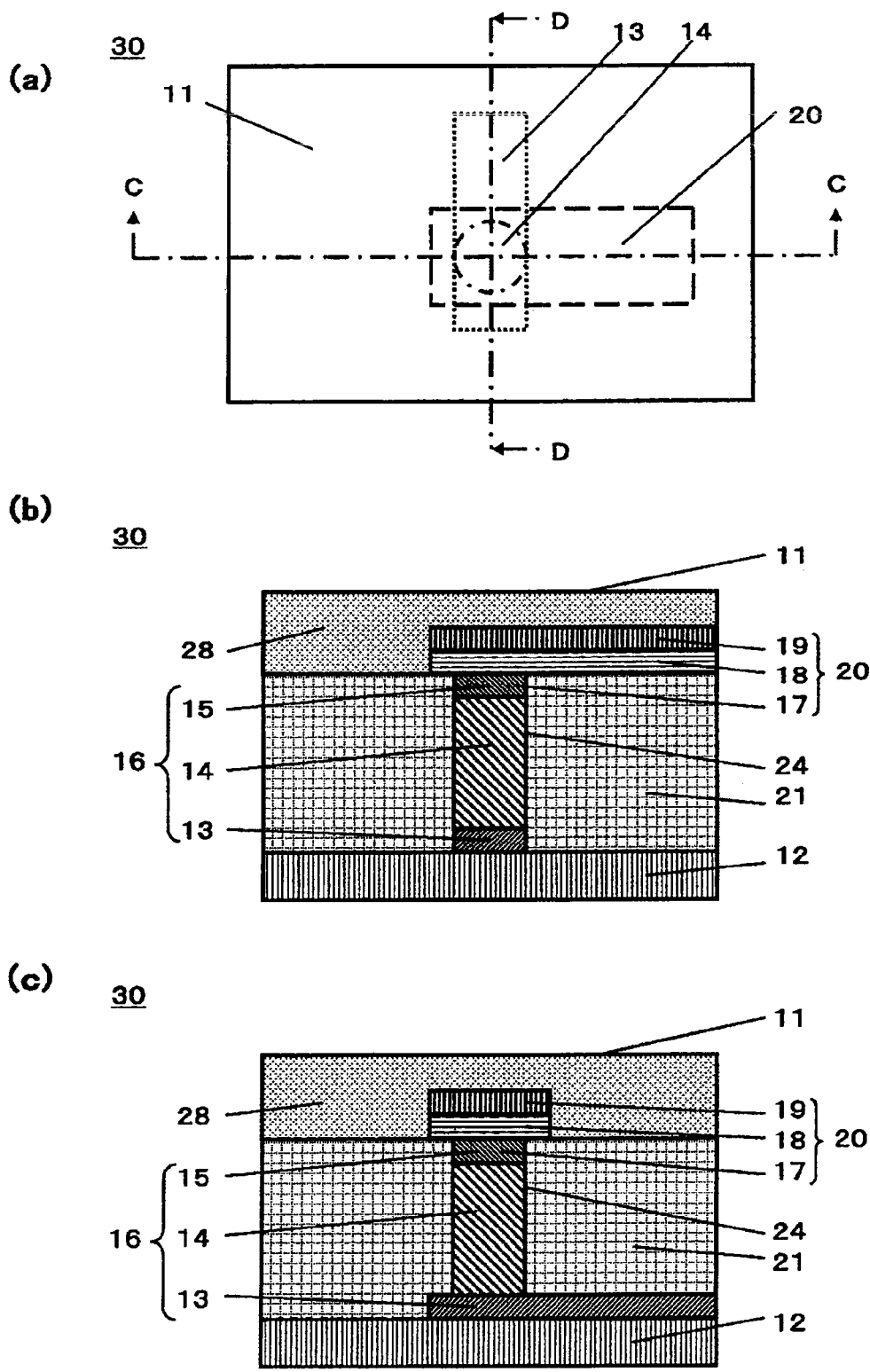
FIG. 2 are schematic configuration diagrams of the nonvolatile memory element in Embodiment 1 of the present invention.

FIG. 2 are schematic configuration diagrams of a nonvolatile memory element 30 which is one example of the present embodiment, can be manufactured by a manufacturing process simpler than the manufacturing process of the nonvolatile memory element 10, and can be highly integrated. FIG. 2(a) is a schematic diagram showing a schematic configuration of the nonvolatile memory element 30 when viewed from the semiconductor chip surface 11. FIG. 2(b) is a schematic cross-sectional view taken along line C-C of FIG. 2(a) when viewed from a direction indicated by arrows C. FIG. 2(c) is a schematic cross-sectional view taken along line D-D of FIG. 2(a) when viewed from a direction indicated by arrows D. The nonvolatile memory element 30 of FIG. 2 is configured to be more suitable for high integration than the nonvolatile memory element 10 of FIG. 1.

To be specific, as shown in FIGS. 2(b) and 2(c), the nonvolatile memory element 30 is configured such that the resistance variable element 16 and the rectifying element 20 are formed on the substrate 12. The resistance variable element 16 is configured such that the resistance variable layer 14 made of the metal oxide material is sandwiched between the upper electrode 15 and the lower electrode 13. The rectifying element 20 is connected to the resistance variable element 16 and is configured such that the blocking layer 18 is sandwiched between the first electrode layer 17 located on a lower side of the blocking layer 18 and the second electrode layer 19 located on an upper side of the blocking layer 18. As shown in FIGS. 2(b) and 2(c), the upper electrode 15 and the first electrode layer 17 are formed as a single electrode (common electrode). The resistance variable element 16 and the rectifying element 20 are connected to each other in series in the stack direction, and the blocking layer 18 is formed as the barrier layer having the hydrogen barrier property. In addition, one or both of the first electrode layer 17 and the second electrode layer 19 may be configured to be made of the material having the hydrogen barrier property. Moreover, one or both of the first interlayer insulating layer 21 and a second interlayer insulating layer 28 (interlayer insulating layer formed on the first interlayer insulating layer 21 so as to cover the blocking layer 18 and the second electrode layer 19) may be made of the material having the hydrogen barrier property.

Unlike the nonvolatile memory element 10 of FIG. 1, the nonvolatile memory element 30 of FIG. 2 is configured such that the resistance variable layer 14 is embedded in a first contact hole 24 having a diameter of about 0.1 μm and is disposed on the lower electrode 13. The first contact hole 24 is formed to penetrate the first interlayer insulating layer 21 which is formed on the lower electrode 13 to cover the lower electrode 13. Further, the upper electrode 15 of the resistance variable element 14 is embedded in the first contact hole 24 and disposed on the resistance variable layer 14.

With this configuration, since the resistance variable layer is embedded in the first contact hole, and an upper portion of the resistance variable layer is covered with the layer having the hydrogen barrier property, the possibility that the resistance variable layer contacts hydrogen decreases, and thus, the resistance variable layer is protected from hydrogen. In addition, since the resistance variable layer is embedded in the first contact hole, the resistance variable layer is electrically isolated from the adjacent memory cell. Therefore, the cross talk does not occur, and the resistance variation can be stably repeated. Further, the rectifying element can be formed on the resistance variable layer in a self-aligning manner so as to be electrically isolated from the resistance variable layer. Therefore, the nonvolatile memory element which is highly integrated and does not cause the cross talk can be realized.

Next, operations of the nonvolatile memory element 30 will be explained in reference to the configuration of FIG. 2.

Figure 3:
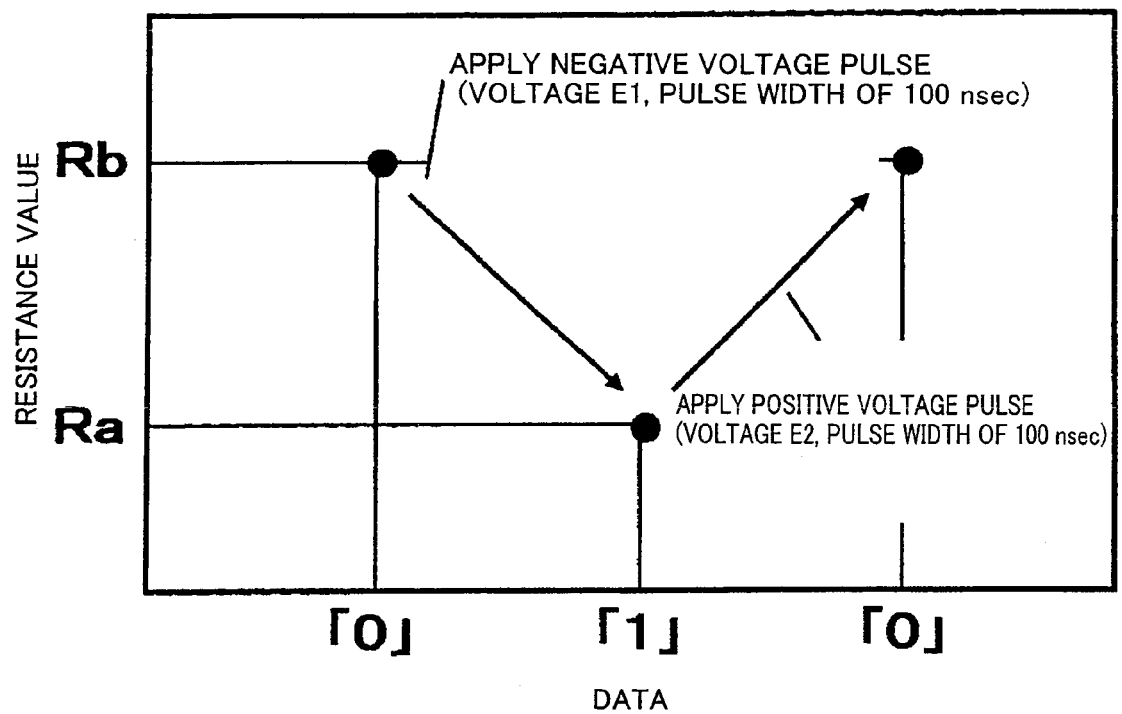
FIG. 3 is a schematic diagram showing changes in a resistance value of the nonvolatile memory element in Embodiment 1 of the present invention.

FIG. 3 shows changes in a resistance value of the resistance variable element 16 in a case where an electrical pulse is applied to the resistance variable element 16 of the nonvolatile memory element 30 having the configuration of the schematic cross-sectional views shown in FIGS. 2(b) and 2(c). At the beginning of a measurement started immediately after the resistance variable element 16 is formed, the resistance value of the resistance variable element 16 varies. Therefore, FIG. 3 shows the resistance value obtained after an operation of causing the resistance value of the resistance variable element 16 to be substantially constant.

In a case where two types of electrical pulses each having a pulse width of 100 nsec and different in polarity from each other are alternately applied between the lower electrode 13 of the resistance variable element 16 of the nonvolatile memory element 30 and the second electrode layer 19 of the rectifying element 20, the resistance value of the resistance variable element 16 sandwiched between the above electrodes changes as shown in FIG. 3. To be specific, as shown in FIG. 3, in a case where a negative voltage pulse (for example, voltage E1, pulse width of 100 nsec) is applied, the resistance value reduces to a low-resistance value Ra of $2.5 \times 10^3 \Omega$, and in a case where a positive voltage pulse (for example, voltage E2, pulse width of 100 nsec) is applied, the resistance value increases to a high-resistance value Rb of $1.1 \times 10^4 \Omega$. Herein, stable rewriting of the resistance value is realized by the application of the electrical pulses. Note that the electrical pulses are set such that the negative voltage and the positive voltage are −2.1 V and +3.1 V, which are necessary to change the resistance value of the resistance variable element 16 and obtained by voltage dividing to be applied to the resistance variable element 16.

Moreover, as shown in FIG. 3, in a case where any one of two different resistance values Ra and Rb of the resistance variable element 16 is assigned to Data "0", and the other one is assigned to Data "1", Data "0" or Data "1" can be read out depending on whether the resistance value is the resistance value Ra or Rb. In FIG. 3, the larger resistance value Rb is assigned to Data "0", and the smaller resistance value Ra is assigned to Data "1". As shown in FIG. 3, by applying the negative voltage pulse when the resistance value of the resistance variable element 16 is the resistance value Rb, the resistance value Ra is stored, and the data of the resistance variable element 16 is rewritten from Data "0" to Data "1". Similarly, by applying the positive voltage pulse when the resistance value of the resistance variable element 16 is the resistance value Ra, the resistance value Rb is stored, and the data of the resistance variable element 16 is rewritten from Data "1" to Data "0".

Figure 4:
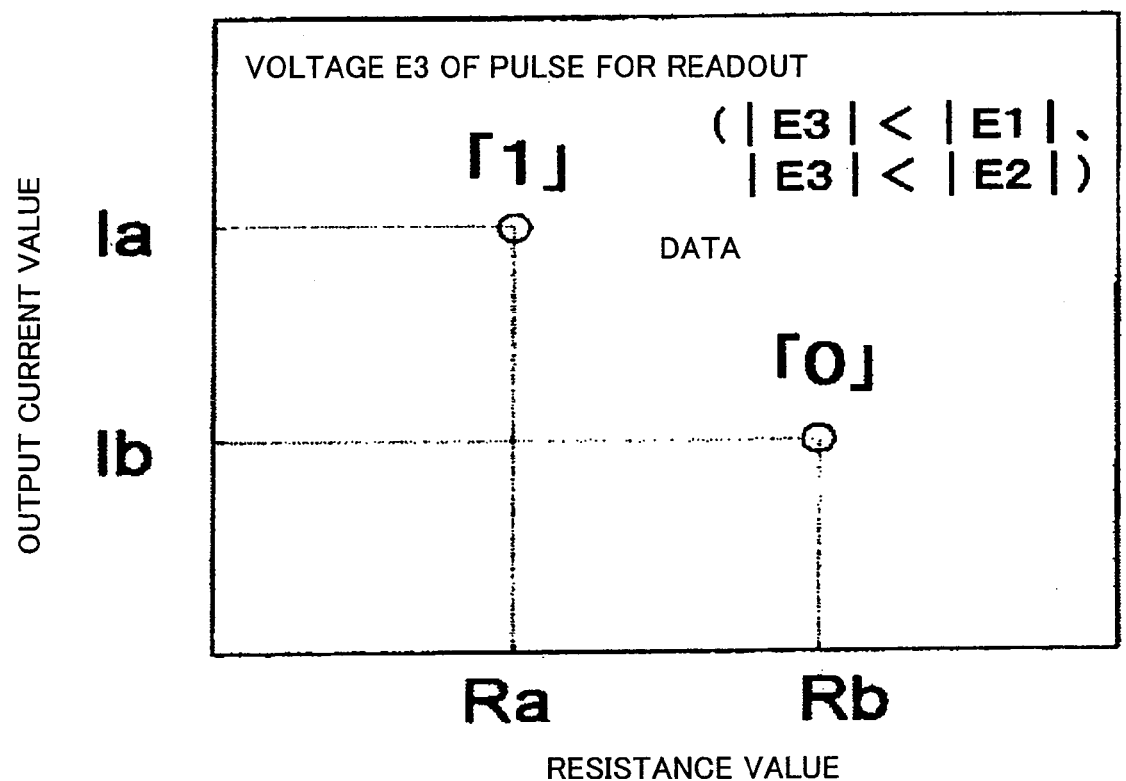
FIG. 4 is a diagram showing a relation among two different resistance values, Data "0", and Data "1".

When reading out the data, a reproduction voltage E3 is applied, which is smaller in amplitude than the electrical pulse applied to change the resistance value of the resistance variable element 16. Thus, an output current value corresponding to the resistance value shown in FIG. 4 is read out. Since an output current value Ia or Ib corresponds to the resistance value Ra or Rb, Data "0" or Data "1" is read out as shown in FIG. 4. Thus, the nonvolatile memory element 30 operates.

The rectifying element 20 of the nonvolatile memory element 30 which operates as above may be configured to be an MIM diode, an MSM diode, or a schottky diode. In the present embodiment, each of the nonvolatile memory elements 10 and 30 uses the MIM diode. In a case where the rectifying element 20 is constituted by the above diode, the current drivability of the resistance variable element 16 can be increased as compared to a case where the rectifying element 20 is constituted by the PN junction diode or the like.

Figure 5:
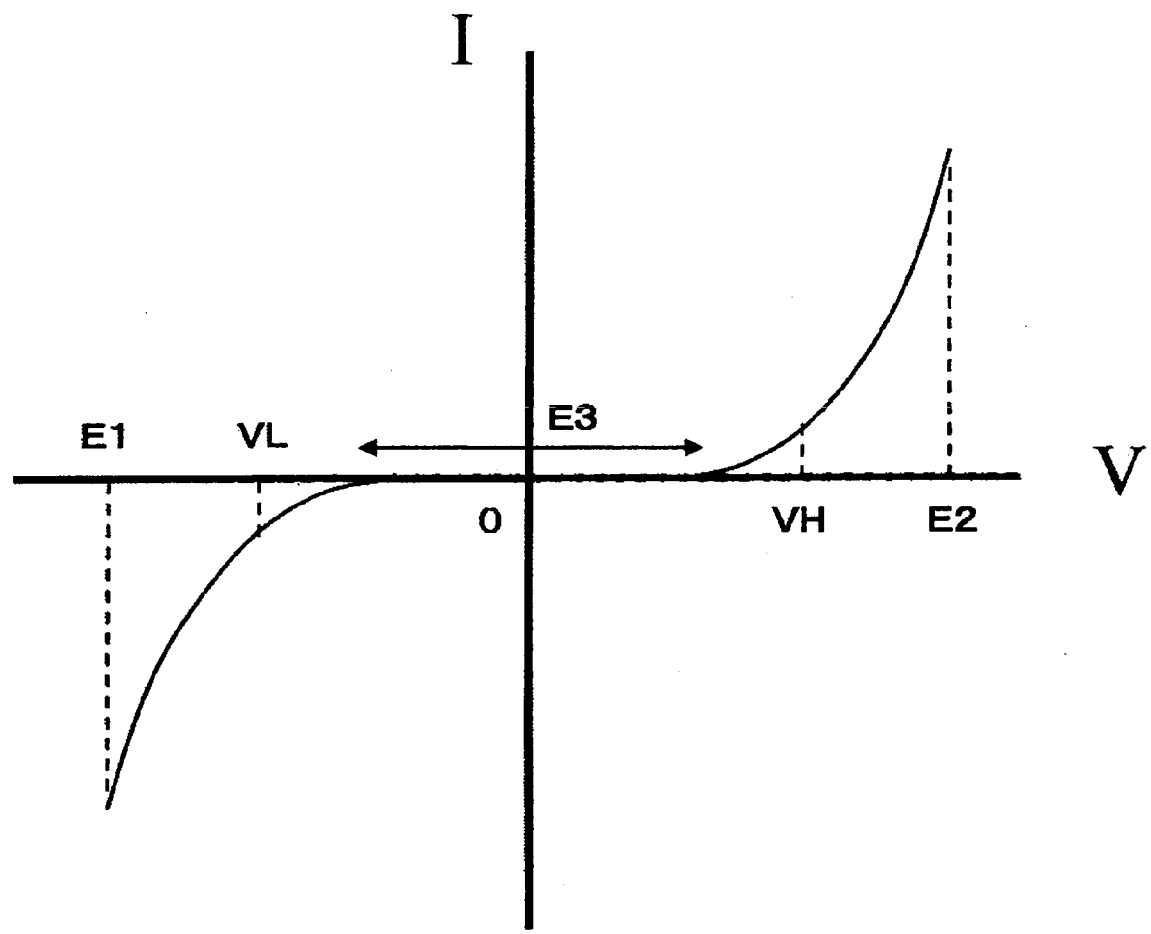
FIG. 5 is a schematic diagram of current-voltage characteristics (I-V characteristics) of an MIM diode.

FIG. 5 schematically shows current-voltage characteristics (I-V characteristics) of the MIM diode. In FIG. 5, when the positive voltage pulse exceeds. VH, the resistance value of the resistance variable element 16 becomes the high-resistance value Rb, and when the negative voltage pulse exceeds VL, the resistance value of the resistance variable element 16 becomes the low-resistance value Ra. The reproduction voltage E3 for reading out the resistance value to read out the data has a magnitude between VH and VL in FIG. 5 to be applied.

In accordance with the I-V characteristics of the MIM diode of FIG. 5, when a large positive or negative voltage is applied to the MIM diode, the MIM diode becomes comparatively low in resistance, and when a small voltage which does not exceed VH and VL is applied to the MIM diode, the MIM diode becomes comparatively high in resistance. Therefore, in each of the nonvolatile memory elements 30 and 10 of the present embodiment, the voltage is applied in the configuration in which the resistance variable element 16 and the MIM diode that is the rectifying element 20 are connected to each other in series. With this configuration, since the MIM diode is high in resistance when the reproduction voltage E3 is applied, a comparatively large part of the reproduction voltage E3 is applied to the MIM diode by voltage dividing. In contrast, since the MIM diode is low in resistance when the large positive voltage E2 or negative voltage E1 for rewriting the resistance value is applied, a comparatively large part of the positive voltage E2 or the negative voltage E1 is applied to the resistance variable element 16 by voltage dividing. Therefore, the rewriting of the resistance value can be carried out by applying the voltage of an appropriate magnitude to the nonvolatile memory element. Moreover, even if a noise or the like superimposes the reproduction voltage E3 for reading out the resistance value when applying the reproduction voltage E3 to the nonvolatile memory element, the resistance value can be safely read out without unintentionally rewriting the resistance value. Even if the MSM diode or the schottky diode is used instead of the MIM diode, the same effect can be obtained although forward and backward characteristics of the diode slightly change.

In the nonvolatile memory element of the present embodiment, since the rectifying element, such as the MIM diode, is connected to the resistance variable element in series, the write disturb can be prevented. Moreover, when data is not read out from or written to the nonvolatile memory element or the memory cell in which the resistance variable element and the rectifying element are connected to each other in series, voltage is not applied to the rectifying element. Therefore, the rectifying element is a high-resistance state. On this account, as compared to the nonvolatile memory element or the memory cell constituted by only the resistance variable element, the resistance variable element can be further protected from electrical noise, and the like. Further, when data is written to the nonvolatile memory element or the memory cell, the voltage applied to the nonvolatile memory element or the memory cell is an applied voltage which has been stably dropped by the rectifying element to have a stable magnitude. Therefore, it is possible to further surely prevent unintentional rewriting caused by a high voltage applied to the resistance variable element. Thus, a highly reliable nonvolatile memory element can be realized.

Figure 6:
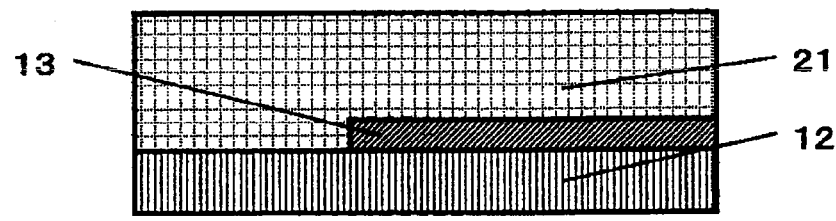
FIGS. 6(a) to 6(d) are schematic cross-sectional views showing a method for manufacturing the nonvolatile memory element of Embodiment 1 of the present invention.
Figure 6:
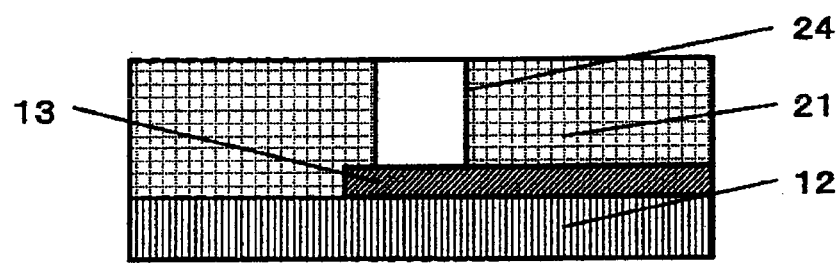
Figure 6:
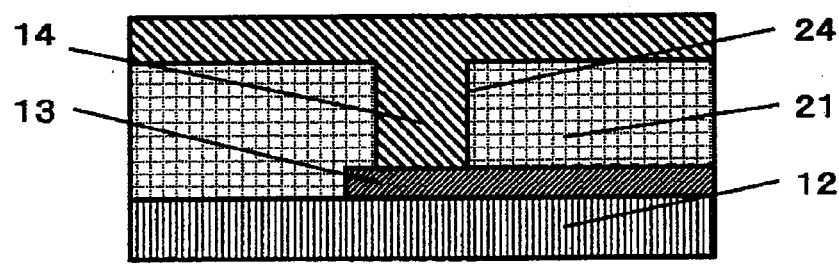
Figure 6:
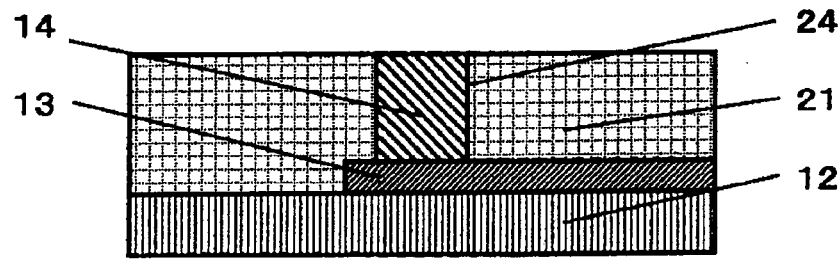
Figure 7:
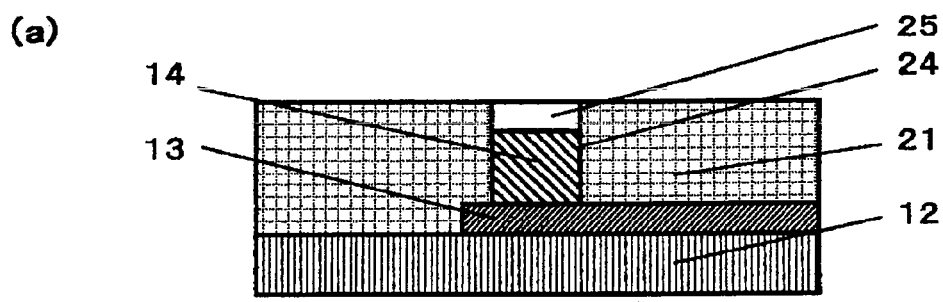
FIGS. 7(a) to 7(d) are schematic cross-sectional views showing the method for manufacturing the nonvolatile memory element of Embodiment 1 of the present invention.
Figure 7:
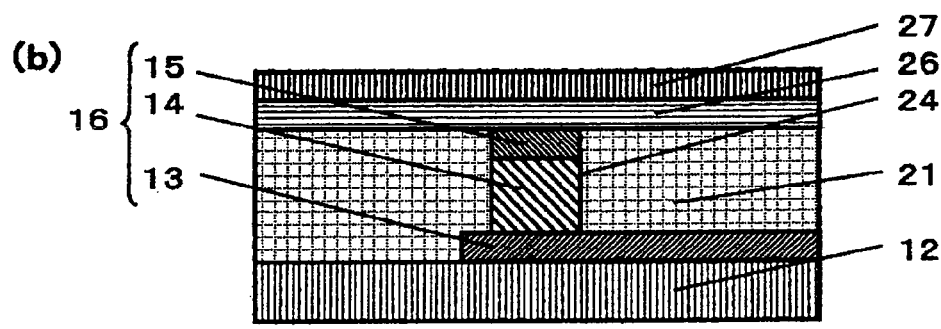
Figure 7:
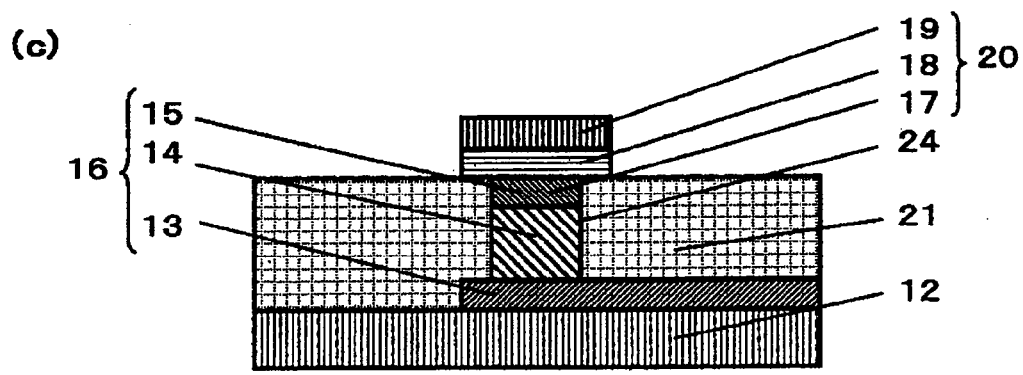
Figure 7:
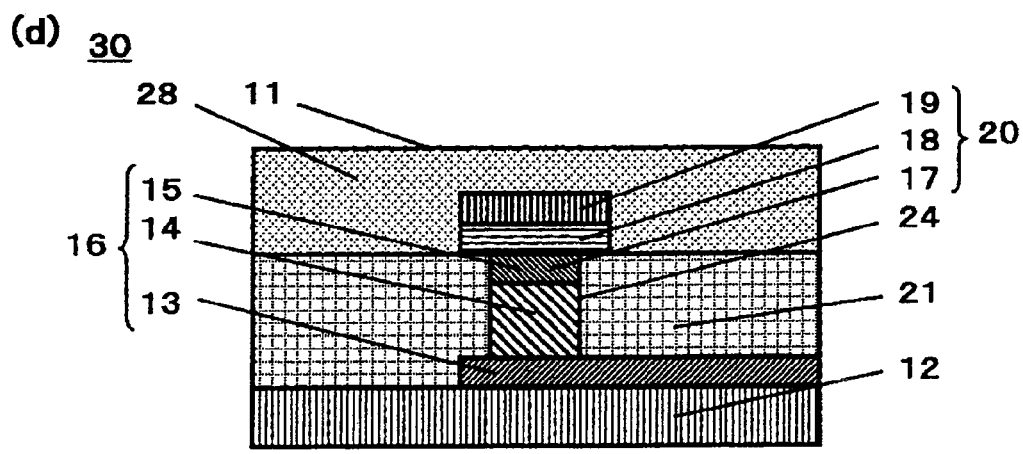

Next, a process flow of a method for manufacturing the nonvolatile memory element 30 according to the present embodiment will be explained in order in reference to FIGS. 6 and 7. To be specific, the method for manufacturing the nonvolatile memory element 30 according to the present embodiment includes: a step of forming the lower electrode 13 on the substrate 12; a resistance layer forming step of forming the resistance variable layer 14 on the lower electrode 13; an upper electrode forming step of forming the upper electrode 15 on the resistance variable layer 14; a step of forming the blocking layer 18 on the upper electrode 15; and a step of forming the second electrode layer 19 on the blocking layer 18. The last two steps correspond to a step of forming the rectifying element. Note that a step of forming a first electrode (not shown) on the upper electrode 15 may be added to the manufacturing method of the present embodiment. However, since the upper electrode 15 and the first electrode (not shown) are formed as a common electrode (the upper electrode and the first electrode layer are formed as a single common electrode) in the nonvolatile memory element 30, an explanation of the step of forming the first electrode is omitted herein.

Here, the blocking layer 18 disposed above the resistance variable layer 14 is formed as the barrier layer having the hydrogen barrier property. In addition, the other layer may be formed as the barrier layer having the hydrogen barrier property. To be specific, in addition to the blocking layer 18, one or a plurality of the upper electrode 15, the first electrode layer 17, the second electrode layer 19, the first interlayer insulating layer 21, and the second interlayer insulating layer 28 may be formed as the barrier layer having the hydrogen barrier property.

Further, the resistance layer forming step includes: a step of forming the first interlayer insulating layer 21 covering the lower electrode 13; a hole forming step of forming on the lower electrode 13 the first contact hole 24 penetrating the first interlayer insulating layer 21; a step of embedding the resistance variable layer 14 in the first contact hole 24 to form the resistance variable layer 14 on the lower electrode 13; and a step of removing the resistance variable layer 14 on the first interlayer insulating layer 21 to flatten a surface of the resistance variable layer 14. The upper electrode forming step includes: a step of removing the resistance variable layer 14 at an upper portion of the first contact hole 24 to form a recess at the upper portion of the first contact hole 24; and a step of embedding the upper electrode 15 in the recess. The process flow of the manufacturing method designed as above will be explained in order.

As shown in FIG. 6(a), for example, the lower electrode 13 made of the Al material is formed on the substrate 12 made of the Si material by deposition and etching so as to have a width of 0.1 µm and a thickness of 0.1 µm and extend in a predetermined direction. Further, an oxide layer ($SiO_2$ layer) is deposited by CVD or the like as the first interlayer insulating layer 21 so as to cover the substrate 12 and the lower electrode 13 and have a thickness of 250 nm.

Then, as shown in FIG. 6(b), for example, the first contact hole 24 having a diameter of 80 nm is formed on the lower electrode 13 by dry etching so as to penetrate the first interlayer insulating layer 21. An oxide layer material of a transition metal is supplied in the first contact hole 24 by sputtering. Thus, as shown in FIG. 6(c), a resistance variable material of $Fe_3O_4$ is embedded in the first contact hole 24 as the resistance variable layer 14, and deposited on the first interlayer insulating layer 21 in the form of a layer.

Further, as shown in FIG. 6(d), the resistance variable layer 14 deposited on the first interlayer insulating layer 21 is removed by CMP (chemical-mechanical polishing) such that the surface of the first interlayer insulating layer 21 is exposed. Thus, the resistance variable layer 14 remains only in the first contact hole 24.

Next, as shown in FIG. 7(a), an upper portion of the resistance variable layer 14 in the first contact hole 24 is removed by using etch back to form a recess 25 having a depth of 30 nm. Then, for example, the Al material as a material of the upper electrode 15 is filled in the recess 25 and deposited on the first interlayer insulating layer 21 in the form of a layer by sputtering, and the electrode material deposited on the first interlayer insulating layer 21 is removed by the CMP. Further, as shown in FIG. 7(b), a SiN layer 26 having a thickness of 10 nm and an Al material 27 having a thickness of 0.1 µm are formed by sputtering or the like on the upper electrode 15 and the first interlayer insulating layer 21 in the form of layers.

Then, by etching of the SiN layer 26 and the Al material 27, the blocking layer 18 which covers the upper electrode 15 and is made of a linear SiN layer having a width of 180 nm and a second electrode 19 made of the Al material are formed as shown in FIG. 7(c).

Further, as shown in FIG. 7(d), the second interlayer insulating layer 28 made of a $SiO_2$ layer is formed as an oxide layer having a thickness of 0.4 µm on the first interlayer insulating layer 21 by CVD or the like so as to cover the blocking layer 18 and the second electrode 19. Thus, the nonvolatile memory element 30 is formed, and the rectifying element 20 is formed on the resistance variable element 16 to be connected to the resistance variable element 16 in the stack direction in series.

The nonvolatile memory element 30 is manufactured by the above process flow. The manufacturing process explained in the present embodiment is designed using the same mask process as a semiconductor planar process adapted for miniaturization, such as a CMOS process, and a special semiconductor process specific to the resistance variable layer 14 is not used in manufacturing the resistance variable element 16. Therefore, the manufacturing process is compatible with the semiconductor process which is being adapted for further miniaturization, and can manufacture the resistance variable layer 14 having a minimum size of the process rule, such as the process rule of less than 100 nm, of the process to be used.

Moreover, by manufacturing the nonvolatile memory element having the above configuration, the blocking layer disposed above the resistance variable layer is formed as the barrier layer having the hydrogen barrier property. Thus, the possibility that the resistance variable layer contacts hydrogen decreases. Then, when data is not read out from or written to the memory cell in which the resistance variable element and the rectifying element are connected to each other in series, voltage is not applied to the rectifying element. Therefore, the rectifying element is a high-resistance state. On this account, as compared to the memory cell constituted by only the resistance variable element, the resistance variable element can be further protected from electrical noise, and the like. Further, when data is read out from or written to the memory cell, the voltage applied to the memory cell is an applied voltage which has been stably dropped by the rectifying element to have a stable magnitude. Therefore, it is possible to surely prevent unintentional rewriting caused by a high voltage applied to the resistance variable element. Thus, a highly reliable nonvolatile memory element can be realized.

Then, in the configuration in which the resistance variable layer and the upper electrode are embedded in the contact hole, the area of the blocking layer is larger than the area of the resistance variable layer. Since the resistance variable layer is surely covered with the layer having the hydrogen barrier property, it is possible to more effectively prevent the resistance variable layer from contacting hydrogen. Further, the rectifying element can be formed on the resistance variable layer in a self-aligning manner so as to be electrically isolated from the resistance variable layer. Therefore, the nonvolatile memory element which is highly integrated and does not cause the cross talk can be realized.

In the present embodiment, a hydrogen barrier layer is formed as the blocking layer by using a SiN layer containing nitrogen. However, the hydrogen barrier layer may be formed as a layer containing nitrogen. Further, one or both of the first electrode layer and the second electrode layer may be formed as the hydrogen barrier layer that is the layer containing nitrogen. Since a material containing nitrogen generally has the hydrogen barrier property, it can be utilized as a material of the barrier layer.

The blocking layer may be formed to contain one or more materials selected from the group consisting of SiN, SiON, and TiAlON. In the case of SiN, the insulating property improves by increasing an element ratio (for example, not less than 1 and not more than 1.33) of N to Si. Thus, the rectifying element 20 becomes the MIM diode. In contrast, the blocking layer becomes similar to a semiconductor by decreasing the element ratio (for example, more than 0 and less than 1) of N to Si. Thus, the rectifying element 20 becomes the MSM diode. Also, in the case of SiON and TiAlON, the characteristics of the diode can be adjusted by adjusting the element ratio in the same manner as above.

In a case where the interlayer insulating layer is made of the material having the hydrogen barrier property, it is preferable to use SiON as the material. In the case of SiON, the element ratio is not especially limited (the same is true in the following explanation).

Moreover, in a case where each of the electrode and the electrode layer is formed to have the hydrogen barrier property, it may be formed to contain one or more materials selected from the group consisting of TiAlN, TiN, TaN, TaAlN, and TaSiN.

Embodiment 2

Figure 8:
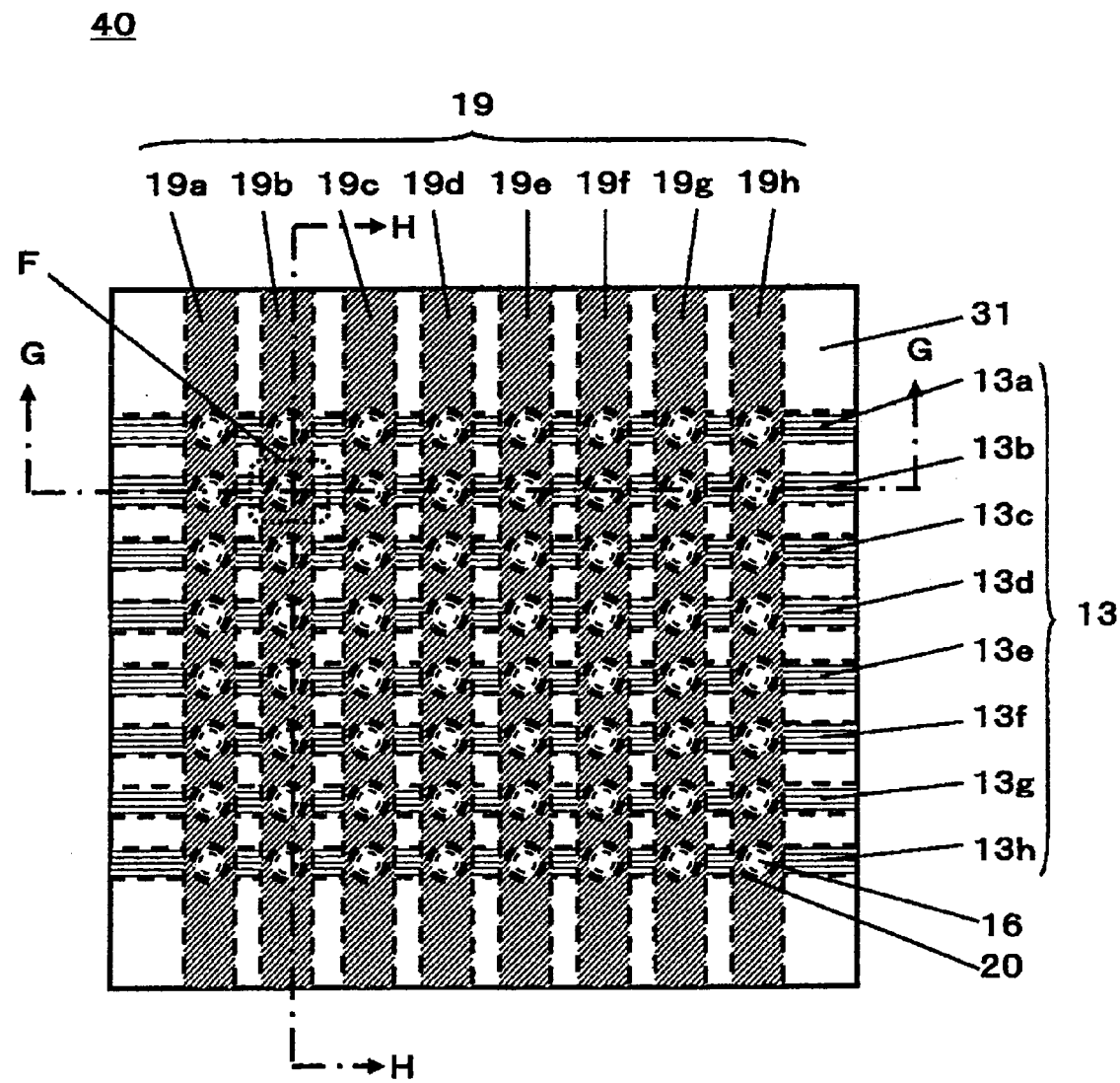
FIG. 8 is a schematic configuration diagram of a nonvolatile memory element array in Embodiment 2 of the present invention, and is a schematic diagram when viewed from the semiconductor chip surface.
Figure 9:
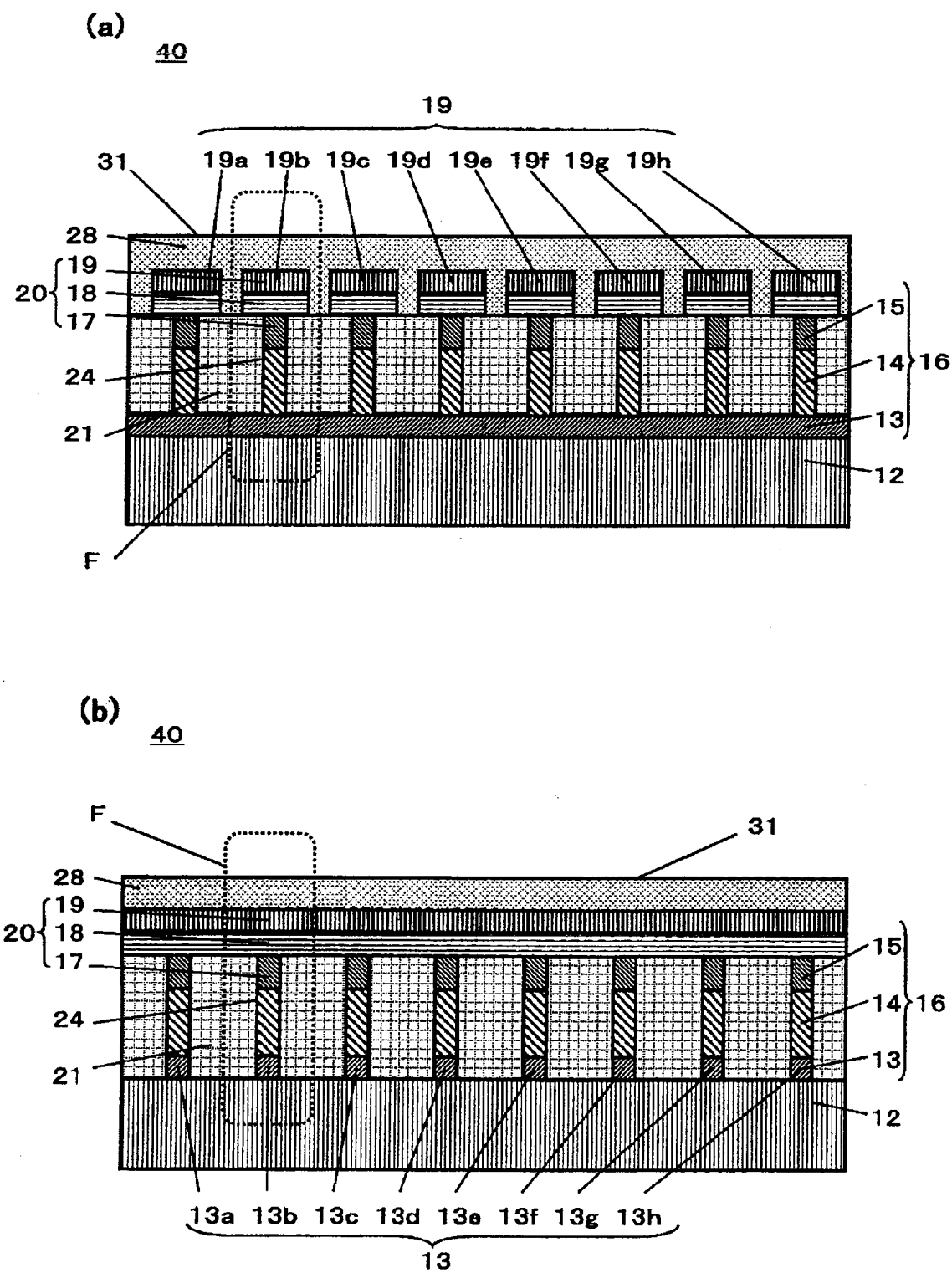
FIG. 9 are schematic configuration diagrams of the nonvolatile memory element array in Embodiment 2 of the present invention.

FIGS. 8 and 9 are diagrams showing Embodiment 2 of the present invention.

FIG. 8 is a schematic configuration diagram showing the configuration of a cross-point type nonvolatile memory element array 40 when viewed from a semiconductor chip surface 31. As shown in FIG. 8, the nonvolatile memory element array 40 is configured such that the nonvolatile memory elements 30 of FIG. 2 are arranged as memory cells F in a cross-point manner. To be specific, in FIG. 8, the lower electrode 13 on the substrate (not shown) and the second electrode layer 19 having a stripe shape crossing the lower electrode 13 at right angle herein are configured to sandwich the resistance variable element 16 and the rectifying element 20. With this configuration, the write disturb is prevented, and in addition, the resistance variable element 16 can be driven by high current drivability. To be specific, the rectifying element 20 may be the MIM diode, the MSM diode, or the schottky diode. In this case, as compared to the PN junction diode or the like, the above diode can drive by a large current drivability the resistance variable element 16 connected to the diode in series.

Herein, for example, eight lower electrodes 13 (13a, 13b, 13c, 13d, 13e, 13f, 13g, and 13h) and eight second electrode layers 19 (19a, 19b, 19c, 19d, 19e, 19f, 19g, and 19h) are shown. Then, at a cross-point where the lower electrode 13 and the second electrode layer 19 cross each other, the resistance variable element 16 and the rectifying element 20 are arranged to be sandwiched between the lower electrode 13 and the second electrode layer 19, thereby constituting the memory cell F. As a whole, a plurality of memory cells F are arranged in a matrix. To be specific, the resistance variable layer (not shown) of the memory cell F is sandwiched between the lower electrode 13 having a stripe shape and the second electrode layer 19 having a stripe shape, and the lower electrode 13 crosses the second electrode layer 19.

In other words, the nonvolatile memory element array 40 is configured such that: a plurality of the lower electrodes 13 are formed to extend in parallel with one another in a first flat plane parallel to a main surface of the substrate 12; a plurality of the second electrode layers 19 are formed to extend in parallel with one another in a second flat plane parallel to the first flat plane and three-dimensionally cross the lower electrodes 13; and the resistance variable layer 14, the upper electrode 15 (first electrode layer 17), and the blocking layer 18 are disposed to correspond to each of three-dimensional cross-points where the lower electrodes 13 and the second electrode layers 19 cross each other and to be interposed between the lower electrode 13 and the second electrode layer 19. Thus, the nonvolatile memory element 16 and the rectifying element 20 are formed to correspond to each of the three-dimensional cross-points.

Although not explained in the present embodiment, the cross-point type nonvolatile memory element may be configured such that: the resistance variable layer (not shown) of the memory cell F is sandwiched between the lower electrode having a stripe shape and the upper electrode having a stripe shape; and the memory cells F are arranged in a matrix in the configuration in which the lower electrodes cross the upper electrodes. To be specific, the upper electrode 15 (first electrode layer 17) may be disposed to be interposed between the lower electrode 13 and the second electrode layer 19 and extend in parallel with the second electrode layer 19 (three-dimensionally cross the lower electrode 13).

FIG. 9(a) is a schematic cross-sectional view taken along line G-G of the nonvolatile memory element array 40 of FIG. 8 when viewed from a direction indicated by arrows G FIG. 9(b) is a schematic cross-sectional view taken along line H-H of the nonvolatile memory element array 40 of FIG. 8 when viewed from a direction indicated by arrows H. Note that the memory cell F of the nonvolatile memory element array 40 has the same configuration as the nonvolatile memory element 30 shown in FIG. 8, and is shown in a region surrounded by a broken line in FIG. 9(a).

As shown in FIG. 9(a), eight memory cells F are arranged. The memory cell F is configured to include the resistance variable element 16 and the rectifying element 20. The resistance variable element 16 is configured such that the resistance variable layer 14 made of the metal oxide material is sandwiched between the lower electrode 13 and the upper electrode 15. The rectifying element 20 is connected to the resistance variable element 16, and is configured such that the blocking layer 18 is sandwiched between the first electrode layer 17 located on a lower side of the blocking layer 18 and the second electrode layer 19 located on an upper side of the blocking layer 18. Then, the nonvolatile memory element array 40 is configured such that: the rectifying element 20 and the resistance variable element 16 are connected to each other in the stack direction in series; and the blocking layer 18 is formed as the layer having the hydrogen barrier property. Further, one or both of the upper electrode 15 also serving as the first electrode layer 17 and the second electrode layer 19 may be the layer having the hydrogen barrier property. One or a plurality of the interlayer insulating layers may be the layer having the hydrogen barrier property. Similarly, as shown in FIG. 9(b), eight memory cells F are arranged. Moreover, FIGS. 9(a) and 9(b) are schematic cross-sectional views of the nonvolatile memory element array 40 when viewed from directions perpendicular to each other. As shown in FIGS. 9(a) and 9(b), the lower electrode 13 having a stripe shape and the second electrode layer 19 having a stripe shape cross each other substantially at right angle, and the resistance variable element 16 including the resistance variable layer 14 and the rectifying element 20 are sandwiched between the lower electrode 13 and the second electrode layer 19.

Moreover, in the nonvolatile memory element array 40, since the upper electrode 15 is embedded in the first contact hole 24 of the first interlayer insulating layer 21, the rectifying element 20 can be isolated. Therefore, the isolated rectifying elements 20 can be integrated without adding a complex step. In this case, as long as the upper electrode 15 is embedded in the first contact hole 24 to be isolated even if the blocking layers 18 are not isolated between adjacent memory cells, the nonvolatile memory element array 40 can operate in the same manner as the configuration in which the blocking layers 18 are electrically isolated, and the rectifying elements 20 is isolated.

As with FIG. 2, as shown in FIGS. 8 and 9, the electrical pulse is applied from the upper electrode 15 to the lower electrode 13 via the rectifying element 20 so as to be applied to the resistance variable layer 14 of the memory cells F. By the application of the electrical pulse, the resistance variable layer 14 shows the characteristics of increasing or decreasing its resistance value. Then, by the change in the resistance value, recording or readout of the data is carried out in the same manner as in Embodiment 1.

Therefore, by the configuration in which the resistance variable element 16 is connected to the rectifying element 20 in the stack direction in series, the data can be rewritten to and read out from the resistance variable element 16 by appropriately utilizing the diode characteristics of the rectifying element 20. To be specific, when the data is rewritten to the resistance variable element 16, the diode 16 is operated in a low resistance state by applying a comparatively high voltage to each of the memory cells F of the nonvolatile memory element array 40. At this time, since the diode 16 is a low resistance state, the voltage drop of the applied voltage is small at the rectifying element 20. Therefore, the voltage can be effectively applied to the resistance variable element 16, so that the resistance variation can be stably carried out. In contrast, when the data is read out from the resistance variable element 16, the rectifying element 20 is operated in a high resistance state by applying a comparatively low voltage to the nonvolatile memory element array 40. At this time, the voltage drop of the applied voltage is large at the rectifying element 20. Therefore, an appropriate voltage is stably applied to the resistance variable element 16, so that the resistance value of the resistance variable element 16 can be read out. At this time, even if a noise voltage is added to the applied voltage via a power supply line, it is almost absorbed at the rectifying element 20. Therefore, it is possible to almost prevent malfunctions, such as unintentional rewriting of the resistance value of the resistance variable element 16.

With this configuration, the cross-point type nonvolatile memory element array 40 which is highly integrated and highly practical can be manufactured by the mass production process compatible with the process adapted for miniaturization in which the process rule of less than 100 nm is main. Since the rectifying element is connected to an upper portion of the resistance variable element to increase the current drivability, the resistance variable element can stably repeat the resistance variation.

The method for manufacturing the cross-point type nonvolatile memory element array 40 explained in the present embodiment can be designed in the same manner as the method for manufacturing the nonvolatile memory element 30 of FIG. 2 explained in Embodiment 1.

Embodiment 3

Figure 10:
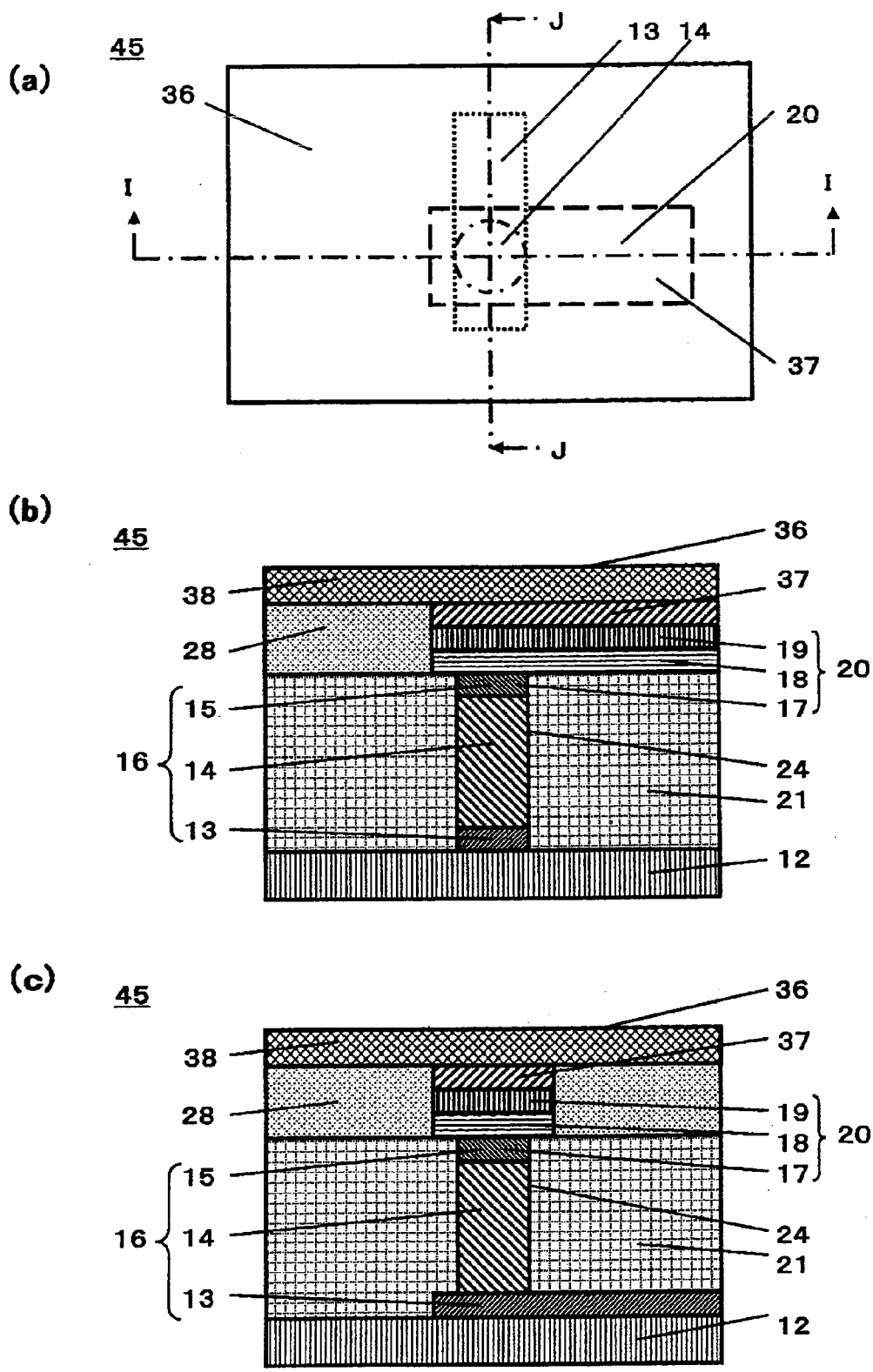
FIG. 10 are schematic configuration diagrams of the nonvolatile memory element in Embodiment 3 of the present invention.

FIG. 10 are schematic configuration diagrams of a nonvolatile memory element 45 of Embodiment 3 of the present invention. FIG. 10(a) is a schematic diagram showing a schematic configuration of the nonvolatile memory element 45 when viewed from a semiconductor chip surface 36. FIG. 10(b) is a schematic cross-sectional view taken along line I-I of FIG. 10(a) when viewed from a direction indicated by arrows I. FIG. 10(c) is a schematic cross-sectional view taken along line J-J of FIG. 10(a) when viewed from a direction indicated by arrows J.

In the present embodiment, unlike Embodiments 1 and 2, a metal wire layer is further formed on the second electrode layer 19 of the nonvolatile memory element 45 to extend in parallel with the second electrode layer 19. Thus, the wiring resistance of the second electrode layer 19 is practically reduced, and this realizes the increase in speed and the decrease in power consumption.

To be specific, as shown in FIGS. 10(b) and 10(c), the nonvolatile memory element 45 is configured such that the resistance variable element 16 and the rectifying element 20 are formed on the substrate 12. The resistance variable element 16 is configured such that the resistance variable layer 14 made of the metal oxide material is sandwiched between the upper electrode 15 and the lower electrode 13. The rectifying element 20 is connected to the resistance variable element 16 and is configured such that the blocking layer 18 is sandwiched between the first electrode layer 17 located on a lower side of the blocking layer 18 and the second electrode layer 19 located on an upper side of the blocking layer 18. As shown in FIGS. 10(b) and 10(c), the upper electrode 15 and the first electrode layer 17 are formed as a single electrode. The resistance variable element 16 and the rectifying element 20 are connected to each other in series in the stack direction, and the blocking layer 18 is formed as the layer having the hydrogen barrier property. Further, one or both of the first electrode layer 17 and the second electrode layer 19 may be the layer having the hydrogen barrier property. One or a plurality of the interlayer insulating layers may be the layer having the hydrogen barrier property.

Moreover, the resistance variable layer 14 is embedded in the first contact hole 24 having a diameter of about 0.1 μm and is disposed on the lower electrode 13. The first contact hole 24 is formed to penetrate the first interlayer insulating layer 21 which is formed on the lower electrode 13 to cover the lower electrode 13. Further, the upper electrode 15 of the resistance variable element 14 is embedded in the first contact hole 24 and disposed on the resistance variable layer 14.

With this configuration, since the resistance variable layer is embedded in the first contact hole, and an upper portion of the resistance variable layer is covered with the layer having the hydrogen barrier property, the possibility that the resistance variable layer contacts hydrogen decreases, and thus, the resistance variable layer is protected from hydrogen. In addition, since the resistance variable layer is embedded in the first contact hole, the resistance variable layer is electrically isolated from the adjacent memory cell. Therefore, the cross talk does not occur, and the resistance variation can be stably repeated. Further, the rectifying element can be formed on the resistance variable layer in a self-aligning manner so as to be electrically isolated from the resistance variable layer. Therefore, the nonvolatile memory element which is highly integrated and does not cause the cross talk can be realized.

Further, as shown in FIGS. 10(b) and 10(c), a groove 34 having a depth of 0.1 μm is formed on the second interlayer insulating layer 23 so as to extend in parallel with the second electrode layer 19, and a metal wire layer 37 made of Cu for example is embedded in the groove 34 so as to have a thickness of 0.1 μm. Then, a third interlayer insulating layer 38 is formed on the metal wire layer 37 and the second interlayer insulating layer 23 so as to have the semiconductor chip surface 36.

With this configuration, the wiring resistance of the second electrode layer and the wiring resistance of the wire connected to the second electrode layer can be set to a low resistance, and the increase in speed and the noise reduction of the memory cell and the nonvolatile memory element can be further realized.

In the step of forming the metal wire layer made of Cu, after the metal wire layer is formed, a hydrogen treatment for stabilizing the characteristics of the metal wire layer is carried out. Even in this case, since the blocking layer of the rectifying element serves as the barrier layer having a hydrogen barrier function, the possibility that hydrogen reaches the resistance variable layer decreases. As a result, the possibility that the resistance variable element deteriorates decreases, and since the wiring resistance can be set to a low resistance by the metal wire layer, the memory cell and the nonvolatile element which are low in parasitic resistance and is highly reliable are manufactured stably (at a high yield rate).

In the present embodiment, the metal wire layer is embedded in the groove. However, a contact hole may be formed instead of the groove, and the metal wire layer may be embedded in the contact hole.

Moreover, in Embodiments 2 and 3, the hydrogen barrier layer may be formed as the blocking layer by using the layer containing nitrogen. Further, one or both of the first electrode layer and the second electrode layer may be formed as the hydrogen barrier layer that is the layer containing nitrogen.

The blocking layer may be formed to contain one or more materials selected from the group consisting of SiN, SiON, and TiAlON. In the case of SiN, the insulating property improves by increasing the element ratio of N to Si. Thus, the rectifying element 20 becomes the MIM diode. In contrast, the blocking layer becomes similar to a semiconductor by decreasing the element ratio of N to Si. Thus, the rectifying element 20 becomes the MSM diode. Also, in the case of SiON and TiAlON, the characteristics of the diode can be adjusted by adjusting the element ratio in the same manner as above.

In a case where the interlayer insulating layer is made of the material having the hydrogen barrier property, it is preferable to use SiON as the material.

Moreover, in a case where each of the electrode and the electrode layer is formed to have the hydrogen barrier property, it may be formed to contain one or more materials selected from the group consisting of TiAlN, TiN, TaN, TaAlN, and TaSiN.

Embodiment 4

Figure 11:
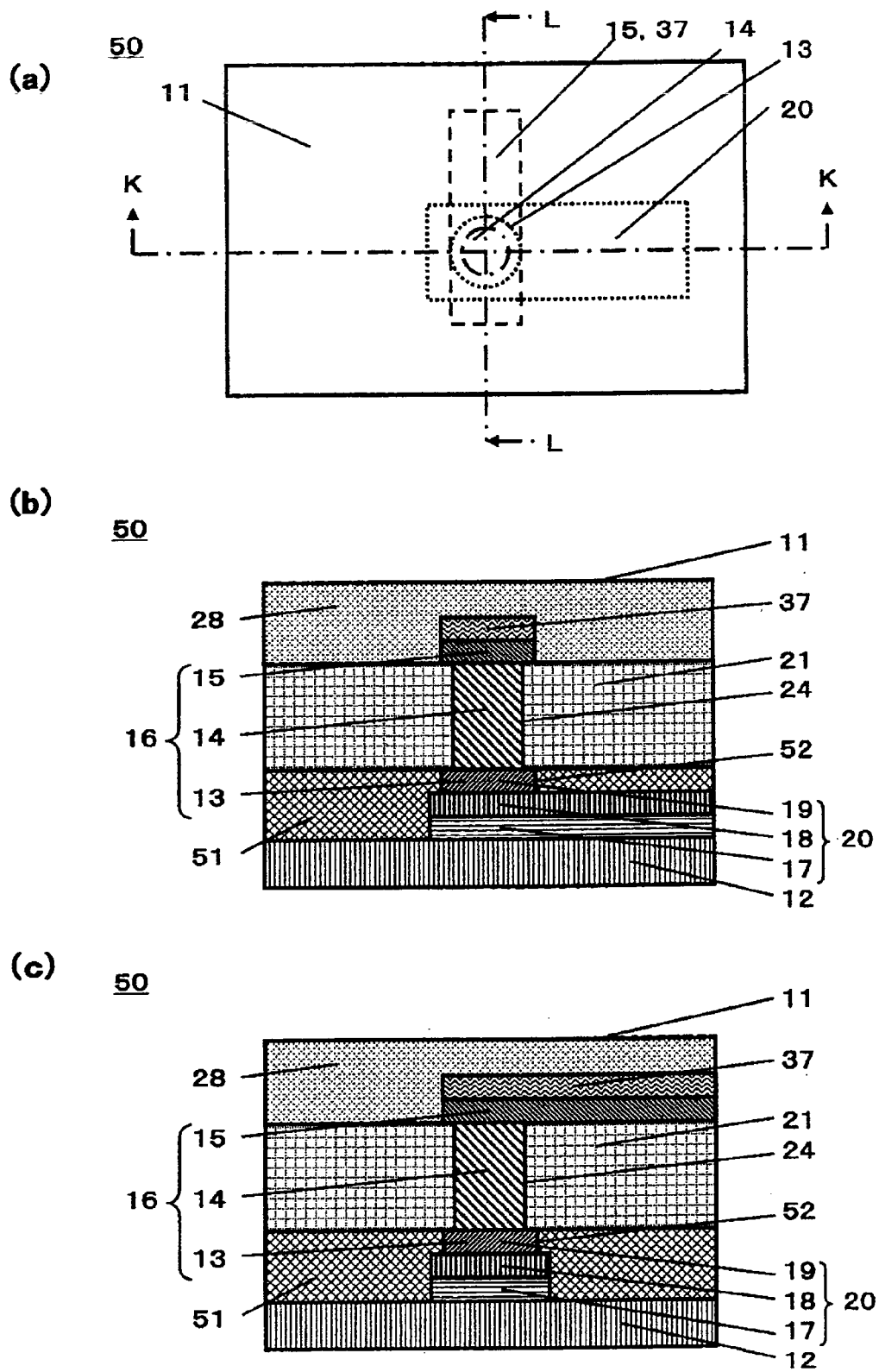
FIG. 11 are schematic configuration diagrams of the nonvolatile memory element in Embodiment 4 of the present invention.

FIG. 11 are schematic configuration diagrams of a nonvolatile memory element 50 of Embodiment 4 of the present invention. FIG. 11(a) is a schematic diagram showing a schematic configuration of the nonvolatile memory element 50 when viewed from the semiconductor chip surface 11. FIG. 11(b) is a schematic cross-sectional view taken along line K-K of FIG. 11(a) when viewed from a direction indicated by arrows K. FIG. 11(c) is a schematic cross-sectional view taken along line L-L of FIG. 11(a) when viewed from a direction indicated by arrows L.

In the present embodiment, unlike Embodiments 1 to 3, the resistance variable element 16 is stacked on the rectifying element 20. To be specific, as shown in FIGS. 1(a), 1(b) and 1(c), the resistance variable layer 14 is formed on the rectifying element 20 so as to be sandwiched between the lower electrode 13 and the upper electrode 15.

Moreover, as shown in FIGS. 11(b) and 11(c), the nonvolatile memory element 50 is configured such that the resistance variable element 16 and the rectifying element 20 are formed on the substrate 12. The resistance variable element 16 is configured such that the resistance variable layer 14 made of the metal oxide material is sandwiched between the upper electrode 15 and the lower electrode 13. The rectifying element 20 is connected to the resistance variable element 16 and is configured such that the blocking layer 18 is sandwiched between the first electrode layer 17 located on a lower side of the blocking layer 18 and the second electrode layer 19 located on an upper side of the blocking layer 18. Then, the rectifying element 20 and the resistance variable element 16 are connected to each other in series in the stack direction, and the blocking layer 18 stacked lower than the resistance variable layer 14 serves as the barrier layer having the hydrogen barrier property. As shown in FIG. 11, the second electrode layer 19 of the rectifying element 20 and the lower electrode 13 of the resistance variable element 16 are formed as a single electrode. Further, the upper electrode 15 may be formed as the barrier layer having the hydrogen barrier property.

Moreover, the resistance variable layer 14 may be surrounded by the first interlayer insulating layer 21 having the hydrogen barrier property, and the upper electrode 15 and the metal wire layer 37 may be surrounded by and covered with the second interlayer insulating layer 28 having the hydrogen barrier property. The rectifying element 20 is covered with a lower interlayer insulating layer 51, and the lower electrode 13 is surrounded by the lower interlayer insulating layer 51. The lower interlayer insulating layer 51 may be formed as the barrier layer having the hydrogen barrier property.

With this configuration, as with Embodiments 1 to 3, by the rectifying element 20 located under and connected to the resistance variable element 16 in the stack direction in series, the write disturb is prevented, and in addition, the resistance variable element 16 can be driven by high current drivability.

Since the blocking layer 18 located under the resistance variable layer 14 has the hydrogen barrier property, the resistance variable layer 14 can be protected from hydrogen generated from, for example, a layer (BPSG layer for example) located on a lower side of the nonvolatile memory element and made of a material which generates hydrogen. This configuration is especially effective in a case where, for example, a plurality of nonvolatile memory element arrays are stacked in the vertical direction. Also, in the present embodiment, in a case where the other layer (the upper electrode 15 and/or the interlayer insulating layer) is made of the material having the hydrogen barrier property, the resistance variable layer 14 can be further effectively protected from hydrogen.

Moreover, the metal wire layer 37 made of Cu is formed on the upper electrode 15. Thus, the wiring resistance of the wire connected to the upper electrode 15 can be set to a low resistance, and the increase in speed and the noise reduction of the memory cell and the nonvolatile memory element can be further realized.

In the step of forming the metal wire layer made of Cu, after the metal wire layer is formed, the hydrogen treatment for stabilizing the characteristics of the metal wire layer is carried out. In this case, by forming the upper electrode of the resistance variable element as the barrier layer having the hydrogen barrier function, the possibility that hydrogen reaches the resistance variable layer decreases. As a result, the deterioration of the resistance variable element is suppressed, and since the wiring resistance can be set to a low resistance by the metal wire layer, the memory cell and the nonvolatile element which are low in parasitic resistance and is highly reliable are manufactured stably.

In the present embodiment, the metal wire layer is embedded in the groove. However, a contact hole may be formed instead of the groove, and the metal wire layer may be embedded in the contact hole.

The operations of the nonvolatile memory element 50 shown in FIG. 11 configured as above are the same as those of the nonvolatile memory element 30 explained in Embodiment 1, so that detailed explanations thereof are omitted.

Figure 12:
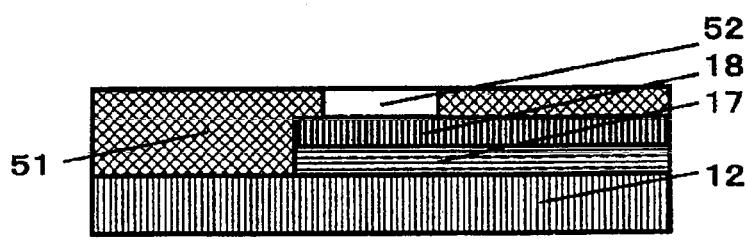
FIGS. 12(a) to 12(d) are schematic cross-sectional views showing the method for manufacturing the nonvolatile memory element of Embodiment 4 of the present invention.
Figure 12:
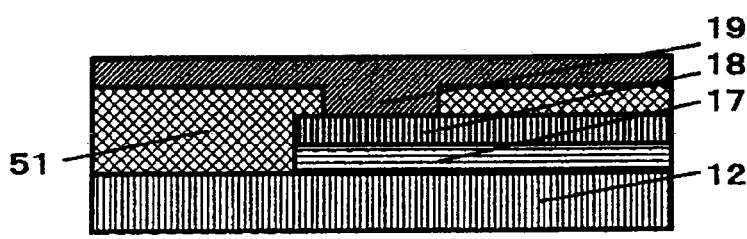
Figure 12:
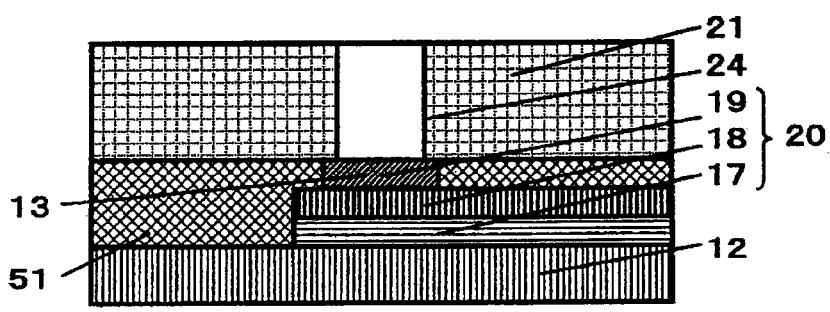
Figure 12:
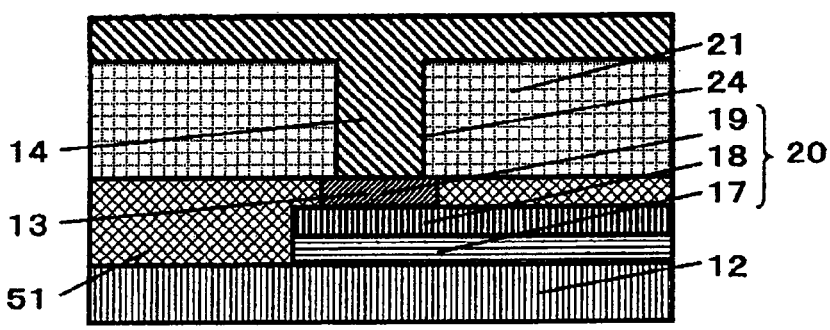
Figure 13:
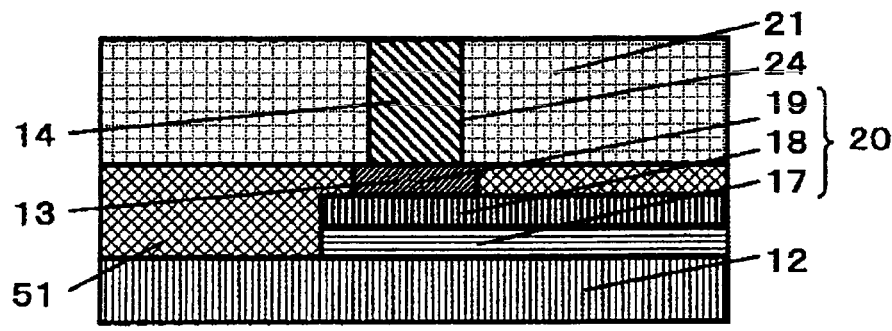
FIGS. 13(a) to 13(c) are schematic cross-sectional views showing the method for manufacturing the nonvolatile memory element of Embodiment 4 of the present invention.
Figure 13:
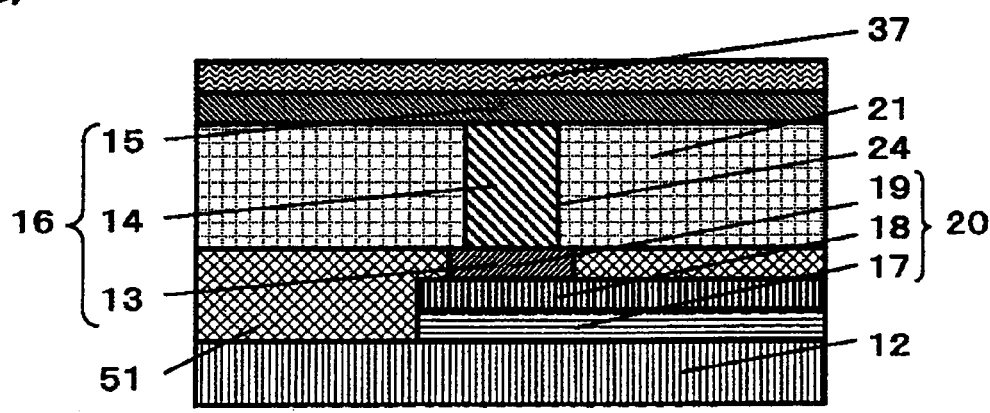
Figure 13:
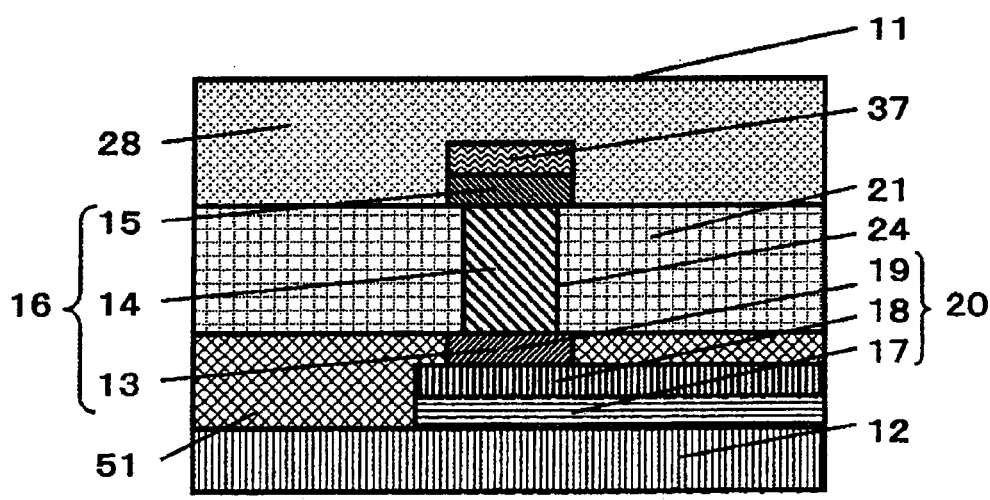

Next, a process flow of a method for manufacturing the nonvolatile memory element 50 according to the present embodiment will be explained in order in reference to FIGS. 12 and 13. To be specific, the method for manufacturing the nonvolatile memory element 50 according to the present embodiment includes: a rectifying element forming step of forming the rectifying element 20 including the blocking layer 18 on the substrate 12; the resistance layer forming step of forming the resistance variable layer 14 on the rectifying element 20; and the upper electrode forming step of forming the upper electrode 15 on the resistance variable layer 14. Then, the blocking layer 18 located under the resistance variable layer 14 is formed as the barrier layer having the hydrogen barrier property. The process flow of the manufacturing method designed as above will be explained in order.

As shown in FIG. 12(a), for example, the first electrode layer 17 made of the Al material and the blocking layer 18 made of a SiN layer are stacked on the substrate 12 made of the Si material by CVD or the like so as to each have a thickness of 0.1 μm, and are formed by etching so as to extend in a predetermined direction and have a width of 0.1 μm. Next, an oxide layer made of a SiO$_2$ layer is deposited as the lower interlayer insulating layer 51 by CVD or the like so as to cover the substrate 12, the first electrode layer 17, and the blocking layer 18 and have a thickness of 0.3 μm. After flattening the surface of the lower interlayer insulating layer 51, a lower contact hole 52 which penetrates the lower interlayer insulating layer 51 and has a diameter of 90 nm is formed on the blocking layer 18 by, for example, dry etching as a lower hole forming step as shown in FIG. 12(a).

As shown in FIG. 12(b), the second electrode layer 19 made of the Al material is embedded in the lower contact hole 52 and also formed on the lower interlayer insulating layer 51 by, for example, CVD. Then, the second electrode layer 19 on the lower interlayer insulating layer 51 is removed by the CMP (chemical-mechanical polishing), so that the second electrode layer 19 remains only in the lower contact hole 52 and is flattened. Further, as shown in FIG. 12(c), an oxide layer made of a $SiO_2$ layer is formed as the first interlayer insulating layer 21 by CVD or the like so as to cover the lower interlayer insulating layer 51 and the second electrode layer 19. Then, the first contact hole 24 having a diameter of 80 nm is formed on the second electrode layer 19 by, for example, dry etching so as to penetrate the first interlayer insulating layer 21. Note that the second electrode layer 19 also serves as the lower electrode 13 of the resistance variable element 16.

Then, as shown in FIG. 12(d), an oxide layer material of a transition metal is supplied to the first contact hole by sputtering. Thus, the resistance variable layer 14 is formed by embedding the resistance variable material made of, for example, $Fe_3O_4$ in the first contact hole 24, and is also deposited on the first interlayer insulating layer 21 in the form of a layer.

Further, as shown in FIG. 13(a), the resistance variable layer 14 deposited on the first interlayer insulating layer 21 is removed by the CMP (chemical-mechanical polishing) such that the surface of the first interlayer insulating layer 21 is exposed. Thus, the resistance variable layer 14 remains only in the first contact hole 24. Then, as shown in FIG. 13(b), for example, a layer for forming the upper electrode 15 made of the Al material and having a thickness of 0.1 μm is stacked on the first interlayer insulating layer 21 by sputtering so as to cover the resistance variable layer 14, and the metal wire layer 37 made of Cu is stacked on the upper electrode 15 so as to have a thickness of 0.1 μm.

As shown in FIG. 13(c), the upper electrode 15 and the metal wire layer 37 covering the resistance variable layer 14 and having a width of 90 nm are formed by etching, and then, a fluorine-doped oxide layer is formed by, for example, CVD, as the second interlayer insulating layer 28 on the first interlayer insulating layer 21 so as to cover the upper electrode 15 and the metal wire layer 37.

The nonvolatile memory element 50 is manufactured by the above process flow. The manufacturing process explained in the present embodiment is designed using the same mask process as a semiconductor planar process adapted for miniaturization, such as a CMOS process, and a special semiconductor process specific to the resistance variable layer 14 is not used in manufacturing the resistance variable element 16. Therefore, the manufacturing process is compatible with the semiconductor process which is being adapted for further miniaturization, and can manufacture the resistance variable layer 14 having a minimum size of the process rule, such as the process rule of less than 100 nm, of the process to be used.

Moreover, by manufacturing the nonvolatile memory element having the above configuration, the blocking layer located under the resistance variable layer is formed as the barrier layer having the hydrogen barrier property. Therefore, the possibility that the resistance variable layer contacts hydrogen generated from below for example decreases, and thus, the resistance variable layer is protected from hydrogen.

In the present embodiment, the hydrogen barrier layer is formed as the blocking layer by using the SiN layer containing nitrogen. However, the blocking layer may be the layer containing nitrogen. Further, the upper electrode may be formed as the hydrogen barrier layer, and may be the layer containing nitrogen. Further, one or both of the first electrode layer and the second electrode layer may be formed as the hydrogen barrier layer that is the layer containing nitrogen. The interlayer insulating layer may be configured to have the hydrogen barrier property.

The blocking layer may be formed to contain one or more materials selected from the group consisting of SiN, SiON, and TiAlON. In the case of SiN, the insulating property improves by increasing the element ratio of N to Si. Thus, the rectifying element 20 becomes the MIM diode. In contrast, the blocking layer becomes similar to a semiconductor by decreasing the element ratio of N to Si. Thus, the rectifying element 20 becomes the MSM diode. Also, in the case of SiON and TiAlON, the characteristics of the diode can be adjusted by adjusting the element ratio in the same manner as above.

In a case where the interlayer insulating layer is made of the material having the hydrogen barrier property, it is preferable to use SiON as the material.

Moreover, in a case where each of the electrode and the electrode layer is formed to have the hydrogen barrier property, it may be formed to contain one or more materials selected from the group consisting of TiAlN, TiN, TaN, TaAlN, and TaSiN.

Embodiment 5

Figure 14:
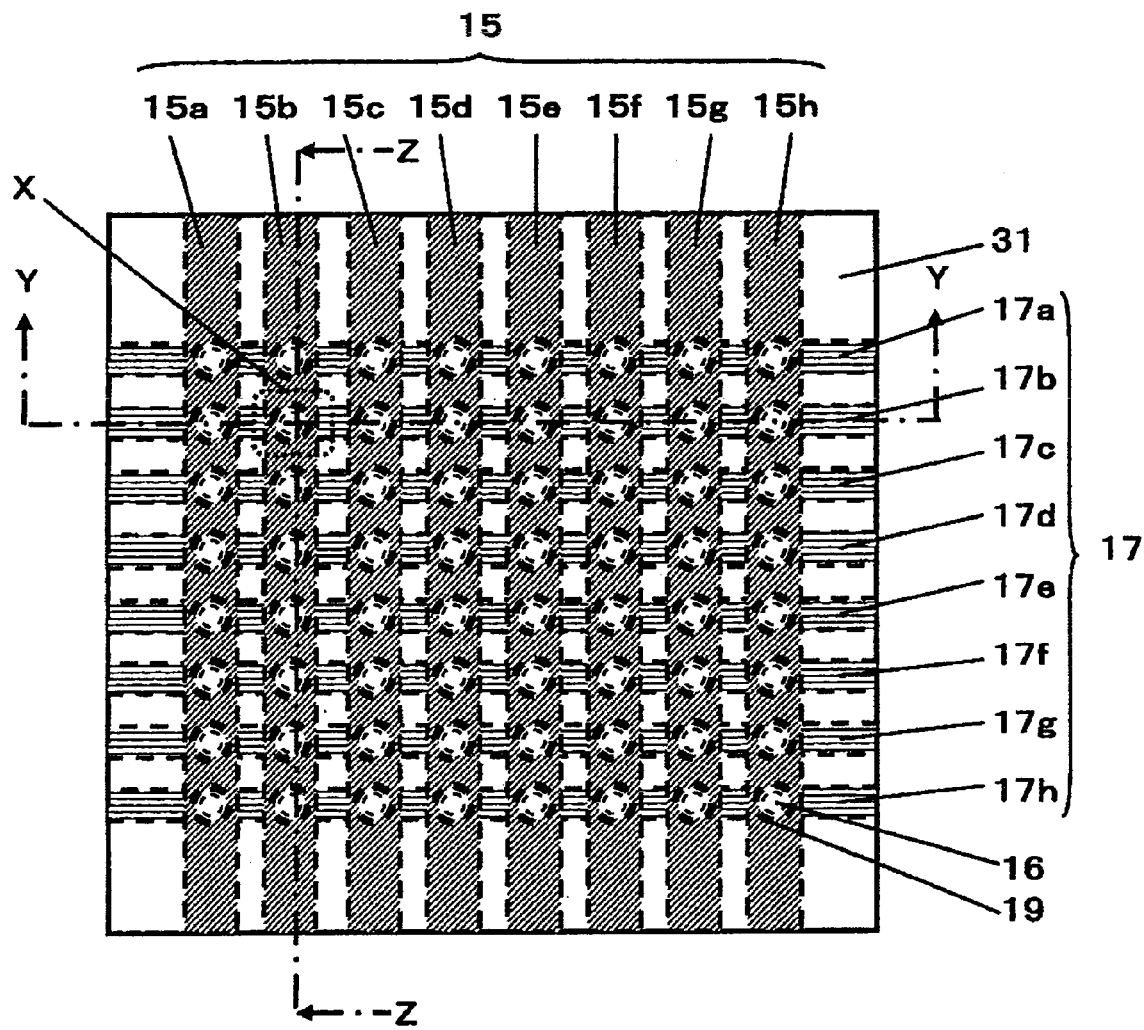
FIG. 14 is a schematic configuration diagram of the nonvolatile memory element array in Embodiment 5 of the present invention, and is a schematic diagram when viewed from the semiconductor chip surface.
Figure 15:
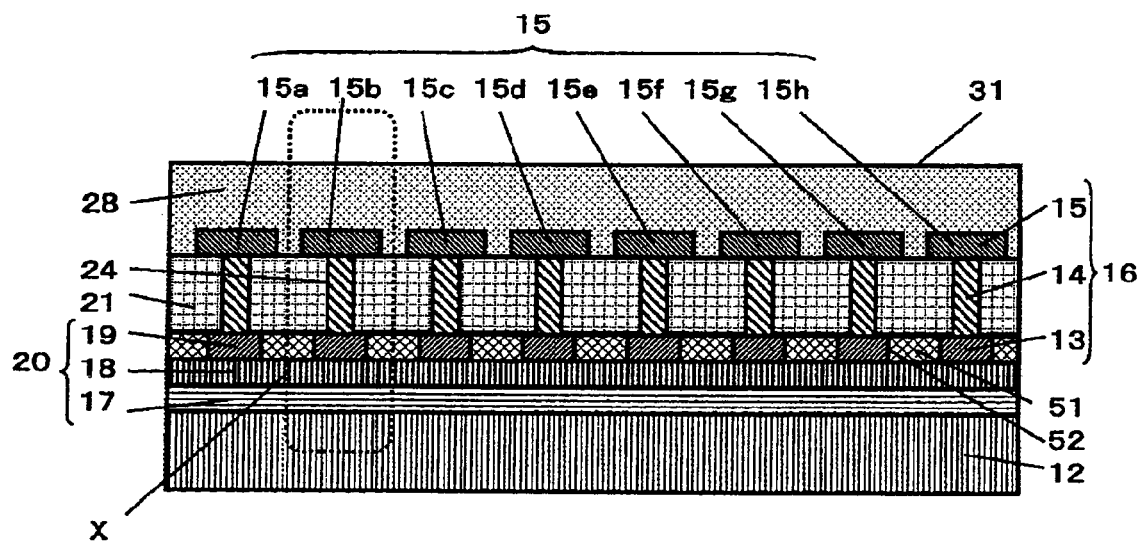
FIG. 15 are schematic configuration diagrams of the nonvolatile memory element array in Embodiment 5 of the present invention.
Figure 15:
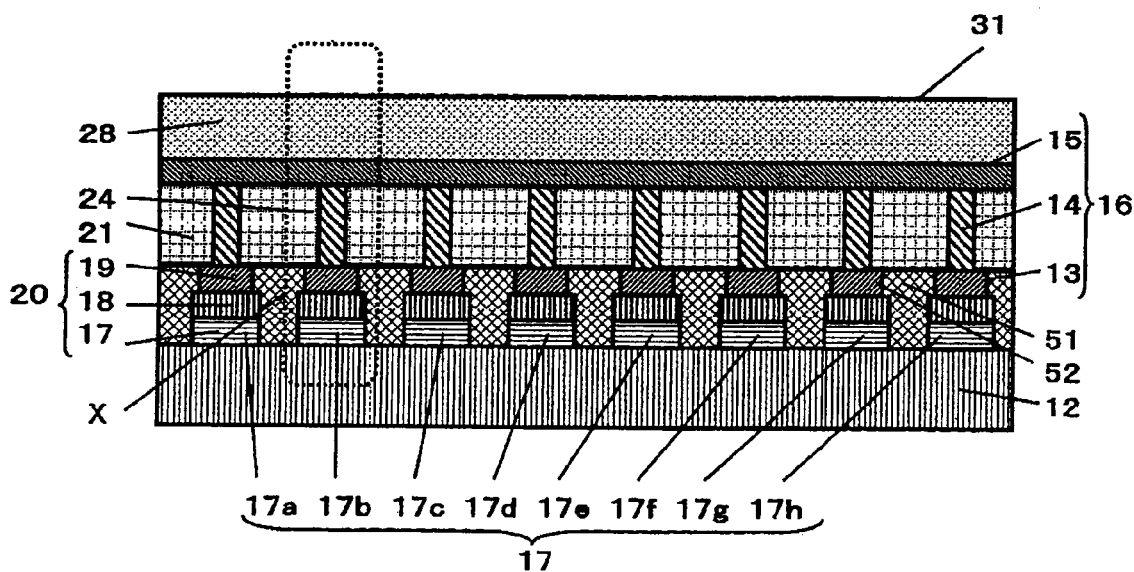

FIGS. 14 and 15 are diagrams showing Embodiment 5 of the present invention.

FIG. 14 is a schematic configuration diagram of the configuration of a cross-point type nonvolatile memory element array 55 when viewed from the semiconductor chip surface 31. As shown in FIG. 14, the nonvolatile memory element array 55 is configured such that the nonvolatile memory elements 50 of FIG. 11 are arranged as memory cells X in a cross-point manner. To be specific, in FIG. 14, the first electrode layer 17 on the substrate (not shown) and the upper electrode 15 having a stripe shape crossing the first electrode layer 17 at right angle herein are configured to sandwich the resistance variable element 16 and the rectifying element 20.

In other words, the nonvolatile memory element array 55 is configured such that: a plurality of the first electrode layers 17 are formed to extend in parallel with one another in the first flat plane parallel to the main surface of the substrate 12; a plurality of the upper electrodes 15 are formed to extend in parallel with one another in the second flat plane parallel to the first flat plane and three-dimensionally cross the first electrode layers 17; and the blocking layer 18, the second electrode layer 19 (lower electrode 13), and the resistance variable layer 14 are disposed to correspond to each of three-dimensional cross-points where the first electrode layers 17 and the upper electrodes 15 cross each other and to be interposed between the first electrode layer 17 and the upper electrode 15. Thus, the rectifying element 20 and the nonvolatile memory element 16 are formed to correspond to each of the three-dimensional cross-points.

With this configuration, the write disturb is prevented, and in addition, the resistance variable element 16 can be driven by high current drivability. To be specific, the rectifying element 20 may be the MIM diode, the MSM diode, or the schottky diode. As compared to the PN junction diode for example, the above diode can drive by a large current drivability the resistance variable element 16 connected to the diode in series.

Herein, for example, eight first electrode layers 17 (17a, 17b, 17c, 17d, 17e, 17f, 17g, and 17h) and eight upper electrodes 15 (15a, 15b, 15c, 15d, 15e, 15f, 15g, and 15h) are shown. Then, at a cross-point where the first electrode layer 17 and the upper electrode 15 cross each other, the resistance variable element 16 and the rectifying element 20 are arranged to be sandwiched between the first electrode layer 17 and the upper electrode 15, thereby constituting the memory cell X. As a whole, a plurality of memory cells X are arranged in a matrix. To be specific, the resistance variable layer (not shown) of the memory cell X is sandwiched between the first electrode layer 17 having a stripe shape and the upper electrode 15 having a stripe shape, and the first electrode layer 17 crosses the upper electrode 15. Although not explained in the present embodiment, the cross-point type nonvolatile memory element may be configured such that: the resistance variable layer (not shown) of the memory cell X is sandwiched between the lower electrode having a stripe shape and the upper electrode having a stripe shape; and the memory cells X are arranged in a matrix in the configuration in which the lower electrodes cross the upper electrodes. To be specific, the second electrode layer 19 (lower electrode 13) may be disposed to be interposed between the first electrode layer 17 and the upper electrode 15 and extend in parallel with the first electrode layer 17 (three-dimensionally cross the upper electrode 15).

FIG. 15(a) is a schematic cross-sectional view taken along line Y-Y of the nonvolatile memory element array 55 of FIG. 14. FIG. 15(b) is a schematic cross-sectional view taken along line Z-Z of the nonvolatile memory element array 55 of FIG. 14. Note that the memory cell X of the nonvolatile memory element array 55 having the same configuration as the nonvolatile memory element 50 shown in FIG. 11 is shown in a region surrounded by a broken line shown in FIG. 15(a).

As shown in FIG. 15(a), eight memory cells X are arranged. The memory cell X is configured to include the resistance variable element 16 and the rectifying element 20. The resistance variable element 16 is configured such that the resistance variable layer 14 made of the metal oxide material is sandwiched between the lower electrode 13 and the upper electrode 15. The rectifying element 20 is connected to the resistance variable element 16, and is configured such that the blocking layer 18 is sandwiched between the first electrode layer 17 located on a lower side of the blocking layer 18 and the second electrode layer 19 located on an upper side of the blocking layer 18. Unlike the nonvolatile memory element array 40 of FIG. 9, in the present embodiment, the resistance variable element 16 is stacked on the rectifying element 20. Then, the nonvolatile memory element array 55 is configured such that: the rectifying element 20 and the resistance variable element 16 are connected to each other in the stack direction in series; the blocking layer 18 is formed as the layer having the hydrogen barrier property. Similarly, as shown in FIG. 15(b), eight memory cells X are arranged. Moreover, FIGS. 15(a) and 15(b) are schematic cross-sectional views of the nonvolatile memory element array 55 when viewed from directions perpendicular to each other. As shown in FIGS. 15(a) and 15(b), the first electrode layer 17 having a stripe shape and the upper electrode 15 having a stripe shape cross each other substantially at right angle, and the resistance variable element 16 including the resistance variable layer 14 and the rectifying element 20 are sandwiched between the first electrode layer 17 and the upper electrode 15.

Moreover, in the nonvolatile memory element array 55, since the second electrode layer 19 is embedded in the lower contact hole 52 of the lower interlayer insulating layer 51, the rectifying element 20 can be isolated. In this case, as long as the second electrode layer 19 is embedded in the lower contact hole 52 to be isolated even if the blocking layers 18 are not isolated between adjacent memory cells, the nonvolatile memory element array 55 can operate in the same manner as the configuration 111 which the blocking layers 18 are electrically isolated, and the rectifying element 20 is isolated.

As with the configurations shown in FIG. 11, in the configurations shown in FIGS. 14 and 15, the electrical pulse is applied from the upper electrode 15 to the lower electrode 13 and the rectifying element 20 so as to be applied to the resistance variable layer 14 of the memory cells X. By the application of the electrical pulse, the resistance variable layer 14 shows the characteristics of increasing or decreasing its resistance value. Then, by the change in the resistance value, recording or readout of the data is carried out in the same manner as in Embodiment 1.

Therefore, by the configuration in which the resistance variable element 16 is connected to the rectifying element 20 in the stack direction in series, the data can be rewritten to and read out from the resistance variable element 16 by appropriately utilizing the diode characteristics of the rectifying element 20.

With this configuration, the cross-point type nonvolatile memory element array 55 which is highly integrated and highly practical can be manufactured by the mass production process compatible with the process adapted for miniaturization in which the process rule of less than 100 nm is main. Since the rectifying element is connected to a lower portion of the resistance variable element to increase the current drivability, the resistance variable element can stably repeat resistance variation.

The method for manufacturing the cross-point type nonvolatile memory element array 55 explained in the present embodiment is the same as the method for manufacturing the nonvolatile memory element 50 of FIG. 11 explained in Embodiment 4.

Moreover, as explained in Embodiments 1 to 5, the memory cell of the nonvolatile memory element is configured such that the resistance variable element and the rectifying element are connected to each other in series. However, it does not matter whether located on an upper side in the stack direction is the resistance variable element or the rectifying element.

Embodiment 6

Figure 16:
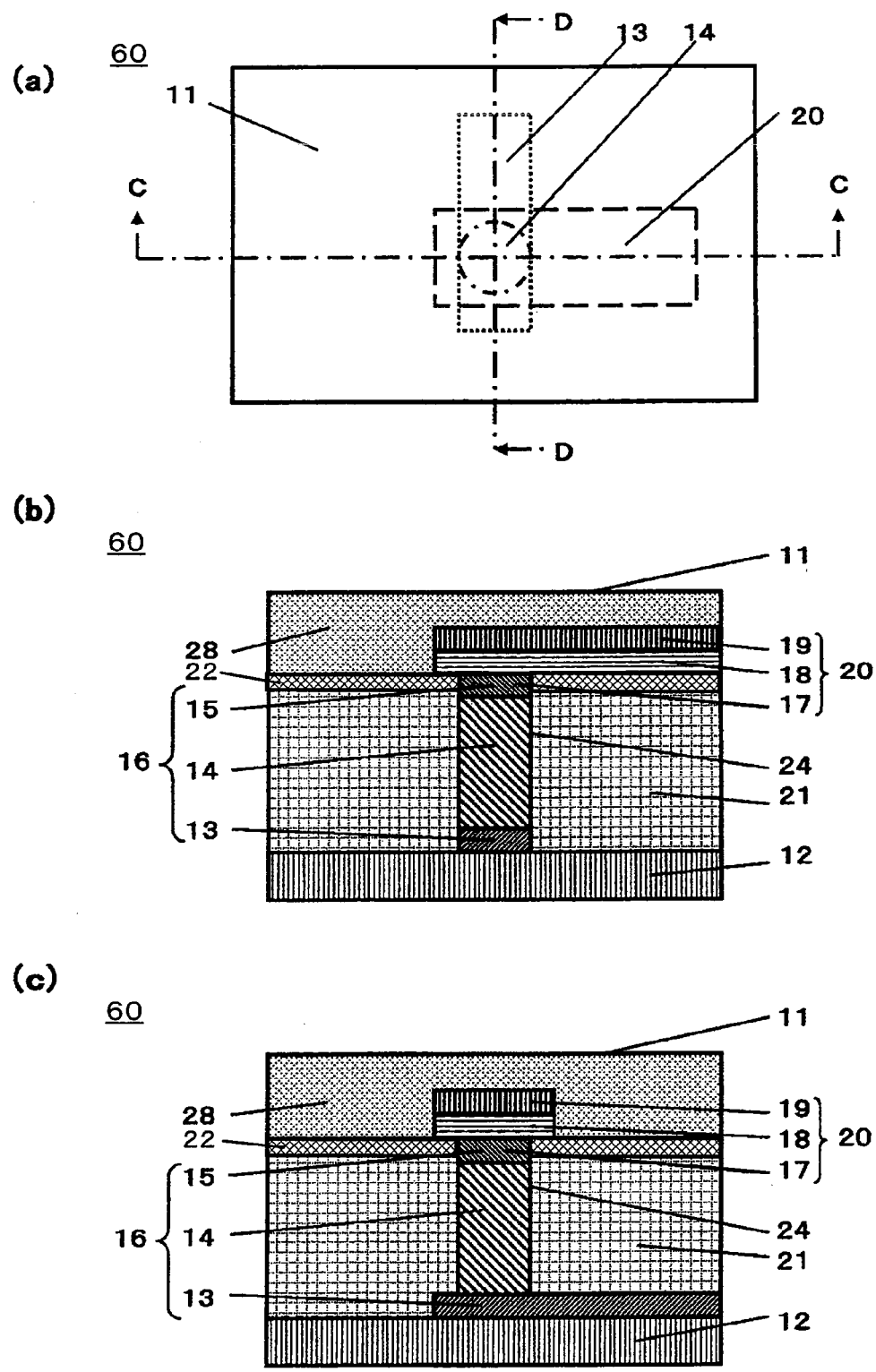
FIG. 16 are schematic configuration diagrams of the nonvolatile memory element in Embodiment 6 of the present invention.

FIG. 16 are schematic configuration diagrams of a nonvolatile memory element 60 of Embodiment 6. FIG. 16(a) is a schematic diagram showing a schematic configuration of the nonvolatile memory element 60 when viewed from the semiconductor chip surface 11. FIG. 16(b) is a schematic cross-sectional view taken along line C-C of FIG. 16(a) when viewed from a direction indicated by arrows C. FIG. 16(c) is a schematic cross-sectional view taken along line D-D of FIG. 16(a) when viewed from a direction indicated by arrows D. As with the nonvolatile memory element 30 of FIG. 2, the nonvolatile memory element 60 of FIG. 16 is configured to be suitable for high integration.

To be specific, as shown in FIGS. 16(b) and 16(c), the nonvolatile memory element 60 is configured such that the resistance variable element 16 and the rectifying element 20 are formed on the substrate 12. The resistance variable element 16 is configured such that the resistance variable layer 14 made of the metal oxide material is sandwiched between the upper electrode 15 and the lower electrode 13. The rectifying element 20 is connected to the resistance variable element 16 and is configured such that the blocking layer 18 is sandwiched between the first electrode layer 17 located on a lower side of the blocking layer 18 and the second electrode layer 19 located on an upper side of the blocking layer 18. As shown in FIGS. 16(b) and 16(c), the upper electrode 15 and the first electrode layer 17 are formed as a single electrode (common electrode). The resistance variable element 16 and the rectifying element 20 are connected to each other in series in the stack direction, and the blocking layer 18 is formed as the barrier layer having the hydrogen barrier property. Further, in the present embodiment, the second interlayer insulating layer 22 is stacked on the first interlayer insulating layer 21, and the second interlayer insulating layer 22 is formed as the barrier layer having the hydrogen barrier property. In addition, one or both of the first electrode layer 17 and the second electrode layer 19 may be configured to have the hydrogen barrier property.

Unlike the nonvolatile memory element 10 of FIG. 1, the nonvolatile memory element 60 of FIG. 16 is configured such that the resistance variable layer 14 is embedded in the first contact hole 24 having a diameter of about 0.1 μm and is disposed on the lower electrode 13. The first contact hole 24 is formed to penetrate the first interlayer insulating layer 21 and the second interlayer insulating layer 22 which are formed on the lower electrode 13 to cover the lower electrode 13. Further, the upper electrode 15 of the resistance variable element 14 is embedded in the first contact hole 24 and disposed on the resistance variable layer 14.

With this configuration, since the resistance variable layer is embedded in the first contact hole, and an upper portion of the resistance variable layer is completely covered with the layers (the blocking layer 18 and the second interlayer insulating layer 22) having the hydrogen barrier property, the resistance variable layer does not contact hydrogen invading from an upper side to be protected from hydrogen. In addition, since the resistance variable layer is embedded in the first contact hole, the resistance variable layer is electrically isolated from the adjacent memory cell. Therefore, the cross talk does not occur, and the resistance variation can be stably repeated. Further, the rectifying element can be formed on the resistance variable layer in a self-aligning manner so as to be electrically isolated from the resistance variable layer. Therefore, the nonvolatile memory element which is highly integrated and does not cause the cross talk can be realized.

The operations of the nonvolatile memory element 60 are the same as those of Embodiment 1, so that explanations thereof are omitted.

Figure 17:
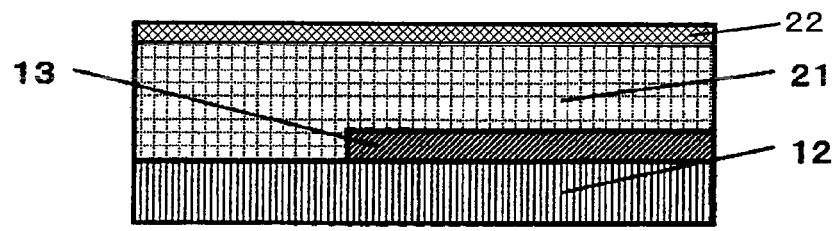
Figure 17:
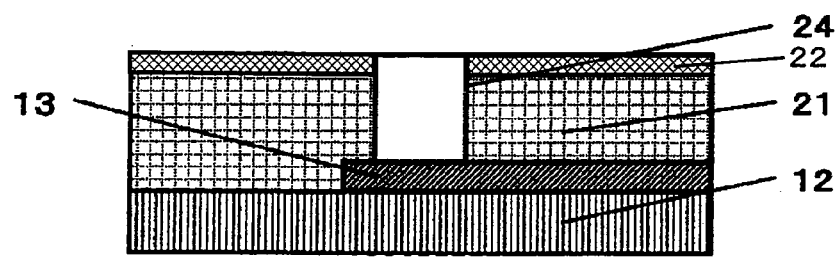
Figure 17:
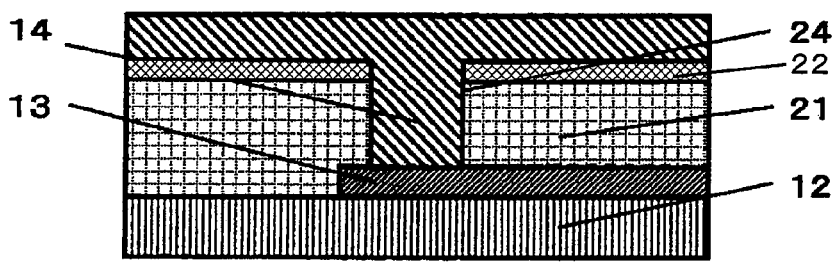
Figure 17:
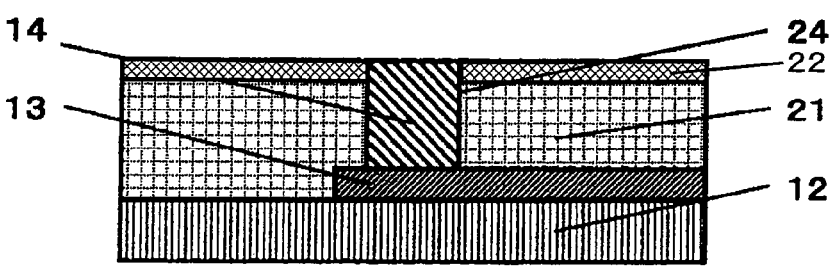
Figure 18:
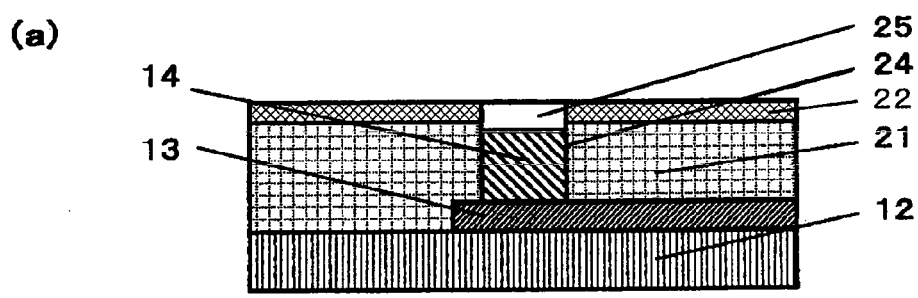
Figure 18:
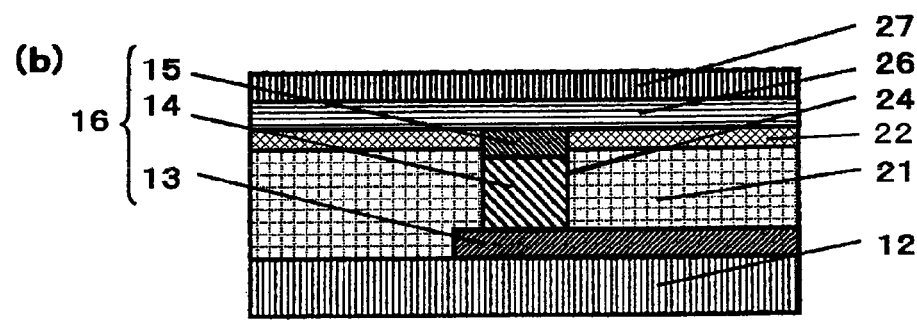
Figure 18:
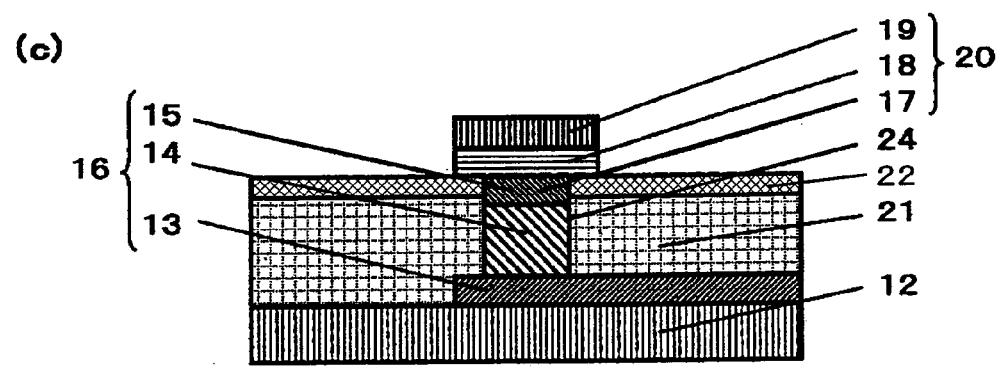
Figure 18:
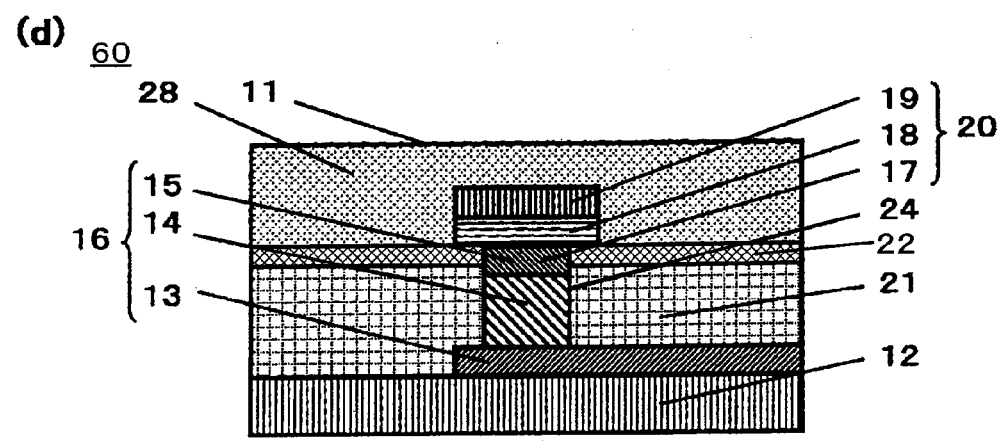

Next, a process flow of a method for manufacturing the nonvolatile memory element 60 according to the present embodiment will be explained in order in reference to FIGS. 17 and 18. To be specific, the method for manufacturing the nonvolatile memory element 60 according to the present embodiment includes: a step of forming the lower electrode 13 on the substrate 12; a resistance layer forming step of forming the resistance variable layer 14 on the lower electrode 13; an upper electrode forming step of forming the upper electrode 15 on the resistance variable layer 14; a step of forming the blocking layer 18 on the upper electrode 15; and a step of forming the second electrode layer 19 on the blocking layer 18. The last two steps correspond to a step of forming the rectifying element. Note that a step of forming the first electrode 17 on the upper electrode 15 may be added to the manufacturing method of the present embodiment. However, since the upper electrode 15 and the first electrode 17 are formed as a common electrode (the upper electrode and the first electrode layer are formed as a single common electrode) in the nonvolatile memory element 60, an explanation of the step of forming the first electrode is omitted herein.

Here, the blocking layer 18 disposed above the resistance variable layer 14 and the second interlayer insulating layer 22 are formed as the barrier layers having the hydrogen barrier property. In addition, the other layer may be formed as the barrier layer having the hydrogen barrier property. To be specific, in addition to the blocking layer 18, one or a plurality of the upper electrode 15, the first electrode 17, the second electrode 19, the first interlayer insulating layer 21, and the third interlayer insulating layer 23 may be formed as the barrier layer having the hydrogen barrier property.

Further, the resistance layer forming step includes: a step of forming the first interlayer insulating layer 21 covering the lower electrode 13; a step of forming the second interlayer insulating layer 22 covering the first interlayer insulating layer 21; a hole forming step of forming on the lower electrode 13 the first contact hole 24 penetrating the first interlayer insulating layer 21 and the second interlayer insulating layer 22; a step of embedding the resistance variable layer 14 in the first contact hole 24 to form the resistance variable layer 14 on the lower electrode 13; and a step of removing the resistance variable layer 14 on the second interlayer insulating layer 22 to flatten surfaces of the resistance variable layer 14 and the second interlayer insulating layer 22. The upper electrode forming step includes: a step of removing the resistance variable layer 14 at an upper portion of the first contact hole 24 to form a recess at the upper portion of the first contact hole 24; and a step of embedding the upper electrode 15 in the recess. The process flow of the manufacturing method designed as above will be explained in order.

As shown in FIG. 17(a), for example, the lower electrode 13 made of the Al material is formed on the substrate 12 made of the Si material by deposition and etching so as to have a width of 0.1 μm and a thickness of 0.1 μm and extend in a predetermined direction. Further, an oxide layer ($SiO_2$ layer) is deposited by CVD or the like as the first interlayer insulating layer 21 so as to cover the substrate 12 and the lower electrode 13 and have a thickness of 250 nm. Further, an oxide layer (SiON layer) having the hydrogen barrier function is deposited as the second interlayer insulating layer 22 by CVD or the like to cover the first interlayer insulating layer 21 and have a thickness of 25 nm.

Then, as shown in FIG. 17(b), for example, the first contact hole 24 having a diameter of 80 nm is formed on the lower electrode 13 by dry etching so as to penetrate the first interlayer insulating layer 21. An oxide layer material of a transition metal is supplied in the first contact hole 24 by sputtering. Thus, as shown in FIG. 17(c), a resistance variable material of $Fe_3O_4$ is embedded in the first contact hole 24 as the resistance variable layer 14, and deposited on the second interlayer insulating layer 22 in the form of a layer.

Further, as shown in FIG. 17(d), the resistance variable layer 14 deposited on the second interlayer insulating layer 22 is removed by CMP (chemical-mechanical polishing) such that the surface of the second interlayer insulating layer 22 is exposed. Thus, the resistance variable layer 14 remains only in the first contact hole 24. Since an etching speed is slow, a SiON layer serves as a stop layer.

Next, as shown in FIG. 18(a), an upper portion of the resistance variable layer 14 in the first contact hole 24 is removed by using etch back to form a recess 25 having a depth of 30 nm. Then, for example, the Al material as a material of the upper electrode 15 is filled in the recess 25 and deposited on the first interlayer insulating layer 21 in the form of a layer by sputtering, and the electrode material deposited on the second interlayer insulating layer 22 is removed by the CMP. Further, as shown in FIG. 18(b), the SiN layer 26 having a thickness of 10 nm and an Al material 27 having a thickness of 0.1 μm are formed by sputtering or the like on the upper electrode 15 and the second interlayer insulating layer 22 in the form of layers.

Then, by etching of the SiN layer 26 and the Al material 27, the blocking layer 18 which covers the upper electrode 15 and is made of a linear SiN layer having a width of 180 nm and a second electrode 19 made of the Al material are formed as shown in FIG. 18(c).

Further, as shown in FIG. 18(d), the third interlayer insulating layer 23 made of a $SiO_2$ layer is formed as an oxide layer having a thickness of 0.4 μm on the first interlayer insulating layer 21 by CVD or the like so as to cover the blocking layer 18 and the second electrode 19. Thus, the nonvolatile memory element 60 is formed, and the rectifying element 20 is formed on the resistance variable element 16 to be connected to the resistance variable element 16 in the stack direction in series.

The nonvolatile memory element 60 is manufactured by the above process flow. The manufacturing process explained in the present embodiment is designed using the same mask process as a semiconductor planar process adapted for miniaturization, such as a CMOS process, and a special semiconductor process specific to the resistance variable layer 14 is not used in manufacturing the resistance variable element 16. Therefore, the manufacturing process is compatible with the semiconductor process which is being adapted for further miniaturization, and can manufacture the resistance variable layer 14 having a minimum size of the process rule, such as the process rule of less than 100 nm, of the process to be used.

Moreover, by manufacturing the nonvolatile memory element having the above configuration, the blocking layer and the second interlayer insulating layer disposed above the resistance variable layer are formed as the barrier layers having the hydrogen barrier property. Thus, the resistance variable layer does not contact hydrogen invading from an upper side to be protected from hydrogen. Then, when data is not read out from or written to the memory cell in which the resistance variable element and the rectifying element are connected to each other in series, voltage is not applied to the rectifying element. Therefore, the rectifying element is a high-resistance state. On this account, as compared to the memory cell constituted by only the resistance variable element, the resistance variable element can be further protected from electrical noise, and the like. Further, when data is read out from or written to the memory cell, the voltage applied to the memory cell is an applied voltage which has been stably dropped by the rectifying element to have a stable magnitude. Therefore, it is possible to surely prevent unintentional rewriting caused by a high voltage applied to the resistance variable element. Thus, a highly reliable nonvolatile memory element can be realized.

Then, by a combination of the configuration in which the resistance variable layer and the upper electrode are embedded in the contact hole and the configuration in which each of the blocking layer and the second interlayer insulating layer serves as the layer having the hydrogen barrier property, the resistance variable layer is surely covered with the layers having the hydrogen barrier property. Therefore, the resistance variable layer does not contact hydrogen invading from an upper side to be completely protected from hydrogen. Further, the rectifying element can be formed on the resistance variable layer in a self-aligning manner so as to be electrically isolated from the resistance variable layer. Therefore, the nonvolatile memory element which is highly integrated and does not cause the cross talk can be realized.

In the present embodiment, a hydrogen barrier layer is formed as the blocking layer by using a SiN layer containing nitrogen. However, the hydrogen barrier layer may be formed as a layer containing nitrogen. Further, one or both of the first electrode layer and the second electrode layer may be formed as the hydrogen barrier layer that is the layer containing nitrogen.

The blocking layer may be formed to contain one or more materials selected from the group consisting of SiN, SiON, and TiAlON. In the case of SiN, the insulating property improves by increasing an element ratio (for example, not less than 1 and not more than 1.33) of N to Si. Thus, the rectifying element 20 becomes the MIM diode. In contrast, the blocking layer becomes similar to a semiconductor by decreasing the element ratio (for example, more than 0 and less than 1) of N to Si. Thus, the rectifying element 20 becomes the MSM diode. Also, in the case of SiON and TiAlON, the characteristics of the diode can be adjusted by adjusting the element ratio in the same manner as above.

In a case where the interlayer insulating layer is made of the material having the hydrogen barrier property, it is preferable to use SiON as the material.

Moreover, in a case where each of the electrode and the electrode layer is formed to have the hydrogen barrier property, it may be formed to contain one or more materials selected from the group consisting of TiAlN, TiN, TaN, TaAlN, and TaSiN.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

The present invention provides a nonvolatile memory element and a manufacturing method thereof which are suitable for miniaturization and realize high mass productivity, and are useful for reduction in size and thickness of electronic devices, such as portable information equipment and information appliances.

The invention claimed is:
1. A nonvolatile memory element array, comprising:
a plurality of nonvolatile memory elements;
a plurality of lower electrodes formed on a first flat plane parallel to a main surface of a substrate so as to extend in parallel with one another; and
a plurality of upper electrodes formed on a second flat plane parallel to the first flat plane so as to extend in parallel with one another and to three-dimensionally cross the plurality of lower electrodes, wherein:
each of the plurality of nonvolatile memory elements is provided at a corresponding one of three-dimensional cross-points where the plurality of lower electrodes and the plurality of upper electrodes cross each other, and
each of the plurality of nonvolatile memory elements comprises:
a resistance variable layer interposed between a corresponding one of the plurality of upper electrodes and a corresponding one of the plurality of lower electrodes at the corresponding one of the three-dimen- sional cross-points, the resistance variable layer containing a metal oxide material; and a rectifying element including a first electrode layer, a second electrode layer, and a blocking layer sandwiched between the first electrode layer and the second electrode layer, wherein:

the resistance variable element and the rectifying element are connected to each other in series in a thickness direction of the resistance variable layer, and the blocking layer has a hydrogen barrier property.

2. A nonvolatile memory element array, comprising:

a plurality of nonvolatile memory elements;

a plurality of lower electrodes formed on a first flat plane parallel to a main surface of a substrate so as to extend in parallel with one another; and a plurality of second electrode layers formed on a second flat plane parallel to the first flat plane so as to extend in parallel with one another and to three-dimensionally cross the plurality of lower electrodes, wherein:

each of the plurality of nonvolatile memory elements is provided at a corresponding one of three-dimensional cross-points where the plurality of lower electrodes and the plurality of second electrode layers cross each other, and each of the plurality of nonvolatile memory elements comprises:

a resistance variable layer interposed between an upper electrode and a corresponding one of the plurality of lower electrodes at the corresponding one of the three-dimensional cross-points, the resistance variable layer containing a metal oxide material; and a rectifying element including a blocking layer sandwiched between a first electrode layer and a corresponding one of the plurality of second electrode layers, wherein:

the resistance variable element and the rectifying element are connected to each other in series in a thickness direction of the resistance variable layer, and the blocking layer has a hydrogen barrier property.

3. A nonvolatile memory element array, comprising:

a plurality of nonvolatile memory elements;

a plurality of first electrode layers formed on a first flat plane parallel to a main surface of a substrate so as to extend in parallel with one another; and a plurality of upper electrodes formed on a second flat plane parallel to the first flat plane so as to extend in parallel with one another and to three-dimensionally cross the plurality of first electrode layers, wherein:

each of the plurality of nonvolatile memory elements is provided at a corresponding one of three-dimensional cross-points where the plurality of first electrode layers and the plurality of upper electrodes cross each other, and each of the plurality of nonvolatile memory elements comprises:

a resistance variable layer interposed between a corresponding one of the plurality of upper electrodes and a lower electrode at the corresponding one of the three-dimensional cross-points, the resistance variable layer containing a metal oxide material; and a rectifying element including a blocking layer sandwiched between a corresponding one of the first electrode layers and a second electrode layer, wherein:

the resistance variable element and the rectifying element are connected to each other in series in a thickness direction of the resistance variable layer, and the blocking layer has a hydrogen barrier property.

4. A nonvolatile memory element, comprising:

a resistance variable element including an upper electrode, a lower electrode, and a resistance variable layer interposed between the upper electrode and the lower electrode, the resistance variable layer containing a metal oxide material; and a rectifying element including a first electrode layer, a second electrode layer, and a blocking layer sandwiched between the first electrode layer and the second electrode layer, wherein:

the resistance variable element and the rectifying element are connected to each other in series in a thickness direction of the resistance variable layer, the blocking layer has a hydrogen barrier property, and the lower electrode and the second electrode layer are formed as a single common electrode.

5. A nonvolatile memory element, comprising:

a resistance variable element including an upper electrode, a lower electrode, and a resistance variable layer interposed between the upper electrode and the lower electrode and containing a metal oxide material;

a rectifying element including a first electrode layer, a second electrode layer, and a blocking layer sandwiched between the first electrode layer and the second electrode layer;

a first interlayer insulating layer formed on the lower electrode to cover the lower electrode; and a first contact hole formed to penetrate the first interlayer insulating layer and reach the lower electrode, wherein:

the resistance variable element and the rectifying element are connected to each other in series in a thickness direction of the resistance variable layer, the blocking layer has a hydrogen barrier property, the first interlayer insulating layer has the hydrogen barrier property, and the resistance variable layer is embedded in the first contact hole.

6. A nonvolatile memory element, comprising:

a resistance variable element including an upper electrode, a lower electrode, and a resistance variable layer interposed between the upper electrode and the lower electrode and containing a metal oxide material;

a rectifying element including a first electrode layer, a second electrode layer, and a blocking layer sandwiched between the first electrode layer and the second electrode layer;

a first interlayer insulating layer formed on the lower electrode to cover the lower electrode;

a second interlayer insulating layer covering the first interlayer insulating layer; and a first contact hole formed to penetrate the first interlayer insulating layer and the second interlayer insulating layer and reach the lower electrode, wherein:

the resistance variable element and the rectifying element are connected to each other in series in a thickness direction of the resistance variable layer, the blocking layer has a hydrogen barrier property, the second interlayer insulating layer has the hydrogen barrier property, and the resistance variable layer is embedded in the first contact hole.

7. The nonvolatile memory element array according to claim 1, wherein the rectifying element is an MIM diode, an MSM diode, or a Schottky diode.

8. The nonvolatile memory element array according to claim 2, wherein the rectifying element is an MIM diode, an MSM diode, or a Schottky diode.

9. The nonvolatile memory element array according to claim 3, wherein the rectifying element is an MIM diode, an MSM diode, or a Schottky diode.

10. The nonvolatile memory element according to claim 4, wherein the rectifying element is an MIM diode, an MSM diode, or a Schottky diode.

11. The nonvolatile memory element according to claim 5, wherein the rectifying element is an MIM diode, an MSM diode, or a Schottky diode.

12. The nonvolatile memory element according to claim 6, wherein the rectifying element is an MIM diode, an MSM diode, or a Schottky diode.

13. The nonvolatile memory element array according to claim 1, wherein the rectifying element is stacked on the resistance variable element.

14. The nonvolatile memory element array according to claim 2, wherein the rectifying element is stacked on the resistance variable element.

15. The nonvolatile memory element array according to claim 3, wherein the rectifying element is stacked on the resistance variable element.

16. The nonvolatile memory element according to claim 4, wherein the rectifying element is stacked on the resistance variable element.

17. The nonvolatile memory element according to claim 5, wherein the rectifying element is stacked on the resistance variable element.

18. The nonvolatile memory element according to claim 6, wherein the rectifying element is stacked on the resistance variable element.

19. The nonvolatile memory element array according to claim 1, wherein when viewed from the thickness direction of the resistance variable layer, the blocking layer is larger in area than the resistance variable layer.

20. The nonvolatile memory element array according to claim 2, wherein when viewed from the thickness direction of the resistance variable layer, the blocking layer is larger in area than the resistance variable layer.

21. The nonvolatile memory element array according to claim 3, wherein when viewed from the thickness direction of the resistance variable layer, the blocking layer is larger in area than the resistance variable layer.

22. The nonvolatile memory element according to claim 4, wherein when viewed from the thickness direction of the resistance variable layer, the blocking layer is larger in area than the resistance variable layer.

23. The nonvolatile memory element according to claim 5, wherein when viewed from the thickness direction of the resistance variable layer, the blocking layer is larger in area than the resistance variable layer.

24. The nonvolatile memory element according to claim 6, wherein when viewed from the thickness direction of the resistance variable layer, the blocking layer is larger in area than the resistance variable layer.

25. The nonvolatile memory element array according to claim 1, wherein at least one of the upper electrode, the first electrode layer, and the second electrode layer has the hydrogen barrier property.

26. The nonvolatile memory element array according to claim 2, wherein at least one of the upper electrode, the first electrode layer, and the second electrode layer has the hydrogen barrier property.

27. The nonvolatile memory element array according to claim 3, wherein at least one of the upper electrode, the first electrode layer, and the second electrode layer has the hydrogen barrier property.

28. The nonvolatile memory element according to claim 4, wherein at least one of the upper electrode, the first electrode layer, and the second electrode layer has the hydrogen barrier property.

29. The nonvolatile memory element according to claim 5, wherein at least one of the upper electrode, the first electrode layer and the second electrode layer has the hydrogen barrier property.

30. The nonvolatile memory element according to claim 6, wherein at least one of the upper electrode, the first electrode layer and the second electrode layer has the hydrogen barrier property.

31. The nonvolatile memory element array according to claim 1, further comprising a metal wire layer on the second electrode layer.

32. The nonvolatile memory element array according to claim 2, further comprising a metal wire layer on the second electrode layer.

33. The nonvolatile memory element array according to claim 3, further comprising a metal wire layer on the second electrode layer.

34. The nonvolatile memory element according to claim 4, further comprising a metal wire layer on the second electrode layer.

35. The nonvolatile memory element according to claim 5, further comprising a metal wire layer on the second electrode layer.

36. The nonvolatile memory element according to claim 6, further comprising a metal wire layer on the second electrode layer.

37. The nonvolatile memory element array according to claim 1, wherein in each of the plurality of nonvolatile memory elements, the corresponding one of the plurality of upper electrodes and the first electrode layer are formed as a single common electrode.

38. The nonvolatile memory element array according to claim 2, wherein in each of the plurality of nonvolatile memory elements, the upper electrode and the first electrode layer are formed as a single common electrode.

39. The nonvolatile memory element array according to claim 3, wherein in each of the plurality of nonvolatile memory elements, the lower electrode and the second electrode layer are formed as a single common electrode.

40. The nonvolatile memory element according to claim 5, wherein the upper electrode and the first electrode layer are formed as a single common electrode.

41. The nonvolatile memory element according to claim 6, wherein the upper electrode and the first electrode layer are formed as a single common electrode.

42. The nonvolatile memory element array according to claim 1, wherein the resistance variable element is stacked on the rectifying element.

43. The nonvolatile memory element array according to claim 2, wherein the resistance variable element is stacked on the rectifying element.

44. The nonvolatile memory element array according to claim 3, wherein the resistance variable element is stacked on the rectifying element.

45. The nonvolatile memory element according to claim 4, wherein the resistance variable element is stacked on the rectifying element.

46. The nonvolatile memory element according to claim 5, wherein the resistance variable element is stacked on the rectifying element.

47. The nonvolatile memory element according to claim 6, wherein the resistance variable element is stacked on the rectifying element.

48. The nonvolatile memory element array according to claim 1, further comprising a metal wire layer disposed on each of the plurality of upper electrodes.

49. The nonvolatile memory element array according to claim 2, further comprising a metal wire layer disposed on the upper electrode.

50. The nonvolatile memory element array according to claim 3, further comprising a metal wire layer disposed on each of the plurality of upper electrodes.

51. The nonvolatile memory element according to claim 4, further comprising a metal wire layer disposed on the upper electrode.

52. The nonvolatile memory element according to claim 5, further comprising a metal wire layer disposed on the upper electrode.

53. The nonvolatile memory element according to claim 6, further comprising a metal wire layer disposed on the upper electrode.

54. The nonvolatile memory element according to claim 5, wherein the upper electrode is embedded in the first contact hole to be located on the resistance variable layer.

55. The nonvolatile memory element array according to claim 1, wherein the blocking layer is a layer containing nitrogen.

56. The nonvolatile memory element array according to claim 2, wherein the blocking layer is a layer containing nitrogen.

57. The nonvolatile memory element array according to claim 3, wherein the blocking layer is a layer containing nitrogen.

58. The nonvolatile memory element according to claim 4, wherein the blocking layer is a layer containing nitrogen.

59. The nonvolatile memory element according to claim 5, wherein the blocking layer is a layer containing nitrogen.

60. The nonvolatile memory element according to claim 6, wherein the blocking layer is a layer containing nitrogen.

61. The nonvolatile memory element array according to claim 1, wherein the blocking layer contains one or more materials selected from the group consisting of SiN, SiON, and TiAlON.

62. The nonvolatile memory element array according to claim 2, wherein the blocking layer contains one or more materials selected from the group consisting of SiN, SiON, and TiAlON.

63. The nonvolatile memory element array according to claim 3, wherein the blocking layer contains one or more materials selected from the group consisting of SiN, SiON, and TiAlON.

64. The nonvolatile memory element according to claim 4, wherein the blocking layer contains one or more materials selected from the group consisting of SiN, SiON, and TiAlON.

65. The nonvolatile memory element according to claim 5, wherein the blocking layer contains one or more materials selected from the group consisting of SiN, SiON, and TiAlON.

66. The nonvolatile memory element according to claim 6, wherein the blocking layer contains one or more materials selected from the group consisting of SiN, SiON, and TiAlON.

67. The nonvolatile memory element array according to claim 1, wherein the plurality of upper electrodes, the plurality of lower electrodes, the first electrode layer or the second electrode layer contains at least one material selected from the group consisting of TiAlN, TiN, TaN, TaAlN, and TaSiN.

68. The nonvolatile memory element array according to claim 2, wherein the upper electrode, the plurality of lower electrodes, the first electrode layer or the plurality of second electrode layers contains at least one material selected from the group consisting of TiAlN, TiN, TaN, TaAlN, and TaSiN.

69. The nonvolatile memory element array according to claim 3, wherein the plurality of upper electrodes, the lower electrode, the plurality of first electrode layers or the second electrode layer contains at least one material selected from the group consisting of TiAlN, TiN, TaN, TaAlN, and TaSiN.

70. The nonvolatile memory element according to claim 4, wherein the upper electrode, the lower electrode, the first electrode layer or the second electrode layer contains at least one material selected from the group consisting of TiAlN, TiN, TaN, TaAlN, and TaSiN.

71. The nonvolatile memory element according to claim 5, wherein the upper electrode, the lower electrode, the first electrode layer or the second electrode layer contains at least one material selected from the group consisting of TiAlN, TiN, TaN, TaAlN, and TaSiN.

72. The nonvolatile memory element according to claim 6, wherein the upper electrode, the lower electrode, the first electrode layer or the second electrode layer contains at least one material selected from the group consisting of TiAlN, TiN, TaN, TaAlN, and TaSiN.

* * * * *